(12) United States Patent
Zheng et al.

(10) Patent No.: US 6,268,072 B1
(45) Date of Patent: Jul. 31, 2001

(54) ELECTROLUMINESCENT DEVICES HAVING PHENYLANTHRACENE-BASED POLYMERS

(75) Inventors: Shiying Zheng, Rochester; Jianmin Shi; Kevin P. Klubek, both of Webster, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/410,767

(22) Filed: Oct. 1, 1999

(51) Int. Cl.$^7$ .................................................. H05B 33/14
(52) U.S. Cl. .................. 428/690; 428/917; 428/704; 428/446; 428/448; 313/504; 313/506
(58) Field of Search .................... 428/690, 917, 428/704, 446, 448; 313/504, 506

(56) References Cited

U.S. PATENT DOCUMENTS

| | | | |
|---|---|---|---|
| 4,356,429 | 10/1982 | Tang | 313/504 |
| 4,769,292 | 9/1988 | Tang et al. | 428/690 |
| 5,429,884 | 7/1995 | Namiki et al. | 428/690 |
| 5,776,622 | 7/1998 | Hung et al. | 428/690 |
| 5,777,070 | 7/1998 | Inbasekaran et al. | |

FOREIGN PATENT DOCUMENTS

| | | |
|---|---|---|
| 94/29883 | 12/1994 | (WO) . |
| 98/27136 | 6/1998 | (WO) . |

OTHER PUBLICATIONS

Tang et al, Organic electroluminescent diodes, Appl. Phys. Lett. 51(12), Sep. 21, 1997, pp. 913–914.
Burroughes et al, Light–emitting diodes based on conjugated polymers, Nature, vol.347, Oct. 11, 1990, pp. 539–541.
Sheats et al, Organic Electroluminescent Devices, Science, vol. 273, Aug. 16, 1996, pp. 884–888.
Cacialli, et al, Characterization of properties of polymeric light–emitting diodes over extended periods, Synthetic Metals 67 (1994) pp. 157–160 (no month).
Berggren et al, Light–emitting diodes with variable colours from polymer blends, Nature, vol. 372, Dec. 1, 1994, pp. 444–446.
Spreitzer et al, Soluble Phenyl–Substituted PPVs–New Materials for Highly Efficient Polymer LEDs, Advanced Materials, 1998, 10, No. 16, pp. 1340–1343 (no month).
Ohmori et al, Blue Electroluminescent Diodes Utilizing Poly(alkylfluorene), Japanese Journal of Appl. Phys. vol. 30, No. 11B, 11/91, pp. L1941–L1943.
Aguiar et al, Light–Emitting Polymers with Pendant Chromophoric Groups, Macromolecules 1995, 28, pp. 4598–4602 (no month).
Andersson et al, Electroluminescene from Substituted Poly-(thiophenes): From Blue to Near Infrared, Macromolecules 1995, 28, pp. 7525–7529 (no month).

Pei et al, Bright Blue Electroluminescence From an Oxadiazole–containing Copolymer, Adv. Mater. 1995, 7, No. 6, pp. 559–561 (no month).
Hilberer et al, Synthesis and Characterization of a New Efficient Blue–Light–Emitting Copolymer, Macromolecules 1995, 28, pp. 4525–4529 (no month).
Remmers et al, The Optical, Electronic and Electroluminescent Properties of Novel Poly(p–phenylene)–Related Polymers, Macromolecules, 1996, 29, pp. 7432–7445 (no month).
Pixton et al, Gas transport properties of adamantane–based polysulfones, Polymer, vol. 36, No. 16, 1995, pp. 3165–3172 (no month).
Chern et al, Low Dielectric Constants of Soluble Polyimides Based on Adamantane, Macromolecules, 1997, 30, pp. 4646–4651 (no month).
Hsiano et al, Synthesis and Characterization of New Adamantane–Based Polyimides, Macromolecules 1998, 31, pp. 7213–7217, (no month).
Miyaura et al, Palladium–Catalyzed Cross–Coupling Reactions of Organoboron Compounds, Chem. Rev. 95, 1995, pp. 2457–2483 (no month).

(List continued on next page.)

*Primary Examiner*—Marie Yamnitzky
*Assistant Examiner*—Ling Xu
(74) *Attorney, Agent, or Firm*—Raymond L. Owens

(57) ABSTRACT

An electroluminescent device comprises an anode, a cathode, and polymer luminescent materials disposed between the anode and cathode, the polymeric luminescent materials includes 9-(4-adamantanyl)phenyl)-10-phenylanthracene-based polymers of the following formula:

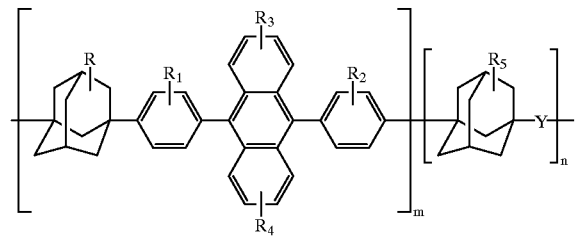

wherein:
  substituents $R, R_1, R_2, R_3, R_4$ and $R_5$ are each individually hydrogen, or alkyl or alkoxy of from 1 to 24 carbon atoms; aryl or substituted aryl of from 6 to 28 carbon atoms; or heteroaryl or substituted heteroaryl of from 4 to 40 carbons; or F, Cl, Br; or a cyano group; or a nitro group; wherein
  the ratio of n/(m+n) is between 0 to 1 wherein m and n are integers but m cannot be 0; and Y are divalent linking groups.

8 Claims, 3 Drawing Sheets

OTHER PUBLICATIONS

Miyaura et al, The Palladium–Catalyzed Cross–Coupling Reaction of Phenylboronic Acid with Haloarenes in the Presence of Bases, Synthetic Communications, 11(7), 1981, pp. 513–519 (no month).

Ranger et al, New Well–Defined Poly(2,7–fluorene) Derivatives: Photoluminescene and Base Doping, Macromolecules, 1997, 30, pp. 7686–7691 (no month).

Kim et al, Water–Soluble Photo–and Electroluminescnet Alkoxy–Sulfonated Poly(p–phenylenes) Synthesized via Palladium Catalysis, Macromolecules, 1998, 31, pp. 964–974 (no month).

Ng et al, Quinoxaline–based conjugated polymers containing ruthenium (II) bipyridine metal complex, Macromol. Rapid Commun, 18, 1997, pp. 1009–1016 (no month).

ELECTROLUMINESCENT DEVICES HAVING PHENYLANTHRACENE-BASED POLYMERS

FIELD OF THE INVENTION

The present invention relates to electroluminescent (EL) devices. More specifically, phenylanthracenie-based polymers used as luminescent materials in polymer EL devices.

BACKGROUND OF THE INVENTION

Electroluminescent devices are opto-electronic devices where light emission is produced in response to an electrical current through the device. The physical model for EL is the radiative recombination of electrons and holes. The term light emitting diode (LED) is commonly used to describe an EL device where the current-voltage behavior is non-linear, meaning that the current through the EL device is dependent on the polarity of the voltage applied to the EL device. Both organic and inorganic materials have been used for the fabrication of LEDs. Inorganic materials such as ZnS/Sn, Ga/Bs, Ga/As have been used in semiconductor lasers, small area displays, LED lamps, etc. However, the drawbacks of inorganic materials include difficulties to process and to obtain large surface areas and efficient blue light.

Organic polymers and small organic molecules used as light-emitting materials in EL devices offer several advantages over inorganic materials, such as simpler manufacturing, low operating voltages, the possibility of producing large area and full-color displays. An efficient multilayer organic LED was first discovered by Tang et al (Tang, C. et al *Appl. Phys. Lett.* 1987, 51, 913–15). Conjugated polymers such as poly(phenylvinylene) (PPV) were first introduced as EL materials by Burroughes et al in 1990 (Burroughes, J. H. *Nature* 1990, 347, 539–41). Considerable progress has been made since then to improve the stability, efficiency, and durability of polymeric LEDs (Sheats, J. R. et al *Science* 1996, 273, 884–888; Cacialli, F. et al *Synth. Met.* 1994, 67, 157–60; Berggren, M. et al *Nature* 1994, 372, 444–6; Spreitzer, H. et al WO 98/27136 (1998); Holmes, A. B. et al WO 94/29883 (1994); and Heinrich B. et al, *Adv. Mater.* 1998, 10(16), 1340). Polymers with wide energy bandgap to emit blue light are important materials because stable, efficient blue-light-emitting materials with high brightness, are desirable for full color EL display applications. With these primary materials, it is possible to produce other colors by a downhill energy transfer process. For instance, a green or red EL emission can be obtained by doping a blue host EL material with a small amount of green or red luminescent material. The first report of blue-emission from a conjugated polymeric LED was for polydialkylfluorene (PF) (Olhmori, Y. et al *Jpn. J. Appl. Phys. Part* 2 1991, 20, L1941–L1943), followed by poly(p-phenylene) (PPP) (Grem, G. et al *Adv. Mater.* 1992, 4, 36–7). Incorporating non-conjugated spacer groups into a conjugated polymer backbone is an effective approach to break conjugation, thus increases the energy bandgap in order to emit blue light. These spacer groups usually prevent the extended conjugation and contribute to the solubility and film-forming properties of the polymer. Blue-light-emitting PPV (Aguiar, M et al *Macromolecules* 1995, 28, 4598–602), polythiophene (Andersson, M. R. et al *Macromolecules* 1995, 28, 7525–9), poly(oxadiazoles) (Pei, Q. et al *Adv. Mater.* 1995, 7, 559–61) and PPP (Hilberer, A et al *Macromolecules* 1995, 28, 4525–9) have been prepared by this approach. However, the incorporation of flexible nonconjugated spacer groups into a rigid conjugated polymer backbone reduces the stiffness of the backbone thus affecting the microscopic molecular order of the polymer (Remmers, M. et al *Macromolecules* 1996, 29, 7432–7445). Such groups can also act as a barrier to the injection and mobility of the charge carriers which leads to high threshold voltages and operating voltages. Thus, it is desirable to develop processable new blue-light-emitting polymers with low driving voltages for full color displays.

SUMMARY OF THE INVENTION

It is an object of the present invention to provide wide energy bandgap luminescent polymeric materials useful for polymer EL devices.

It is a further object of the present invention to provide wide energy bandgap luminescent polymers which emit blue light.

These objects are achieved in an electroluminescent device comprises an anode, a cathode, and polymer luminescent materials disposed between the anode and cathode, the polymeric luminescent materials includes 9-(4-adamantanyl)phenyl)-10-phenylanthracene-based polymers of the following formula:

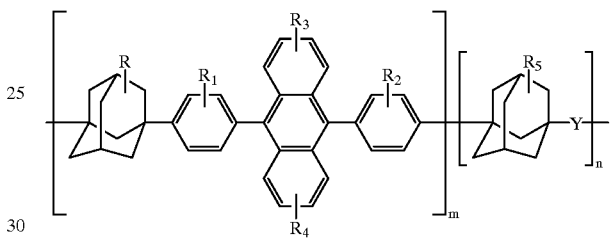

wherein:
substituents R, $R_1$, $R_2$, $R_3$, $R_4$ and $R_5$ are each individually hydrogen, or alkyl or alkoxy of from 1 to 24 carbon atoms; aryl or substituted aryl of from 6 to 28 carbon atoms; or heteroaryl or substituted heteroaryl of from 4 to 40 carbons; or F, Cl, Br; or a cyano group; or a nitro group; wherein the ratio of n/(m+n) is between 0 to 1 wherein m and n are integers but m cannot be 0; and Y are divalent linking groups.

In the formula, Y can be one or the combination of a number of different groups all of which satisfy the above formula.

The present invention provides polymeric luminescent materials with a number of advantages that include good solubility, reduced crystallinity, and better thermal stability. With the primary wide energy bandgap chromophore, 9-(4-adamantanyl)phenyl-10-phenylanthracene, other color emitting luminescent copolymers can be easily designed and produced by introducing the narrow energy bandgap chromophores into the polymeric chain.

DETAILED DESCRIPTION OF THE INVENTION

Figure 1:
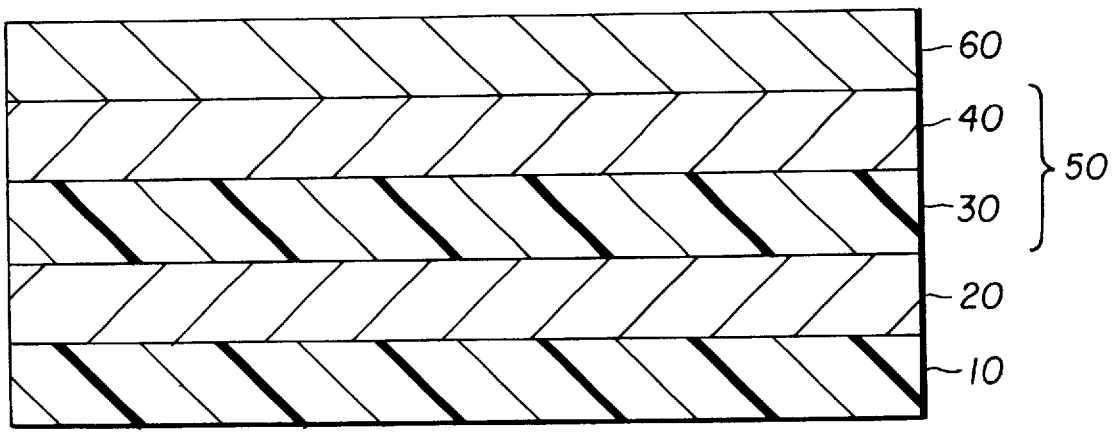
FIG. 1 illustrates in cross-section a bi-layer EL device which can use a polymer in accordance with the present invention.

The present invention provides light-emitting polymers containing rigid adamantane spacer groups with good solubility and thermal stability as shown in formula I. Adamantane has been incorporated into a polymer backbone and has been shown to improve the physical properties of polymers (Pixton, M. R. et al *Polymer* 1995, 36, 3165–72; Chern, Y. -T. et al *Macromolecules* 1997, 30, 4646–4651; and Hsiao, S. -H et al *Macromolecules* 1998, 31, 7213–7217). Incorporation of the adamantane spacer group into the above mentioned polymers in formula I is expected to increase $T_g$, thermal stability, chain rigidity, and solubility, while reducing crystallinity and preventing aggregation of the emitting moiety in the solid state. One of the chromophores in the above mentioned polymer is the blue-light-emissive moiety 9,10-diphenylanthracene. 9,10-Diphenylanthracene chromophore has a large energy bandgap. The energy bandgap is the energy difference between the energy level of the highest occupied molecular orbital (HOMO) and the lowest unoccupied molecular orbital (LUMO). Incorporation of the second comonomer unit Y can serve several purposes:

1) to further improve solubility of the polymer;
2) to improve electron or hole transporting ability; and
3) to tune the emissive color of the polymer.

Therefore, the second comonomer Y can be the groups to improve solubility, or electron or hole transporting mobility, or emissive moiety with narrow energy bandgap. The green- or red-light-emitting polymer can be obtained through intramolecular energy downhill transfer.

The polymer shown in formula I is a homopolymer or a copolymer containing a 9-(4-adamantanyl)phenyl-10-phenylanthracene units, wherein:

the ratio of n/(m+n) is between 0 to 1 wherein m and n are integers but m cannot be 0; preferably the ratio is less than 0.30;

substituents $R_1$, $R_2$, $R_3$, $R_4$, and $R_5$ are each individually hydrogen, or alkyl or alkoxy containing 1 to 24 carbon atoms; aryl or substituted aryl of containing 6 to 28 carbon atoms; or heteroaryl or substituted heteroaryl containing 4 to 40 carbons; or F, Cl, Br; or cyano group; or nitro group. For example, $R_1$, $R_2$, $R_3$, $R_4$, and $R_5$ may represent hydrogen, methyl, ethyl, propyl, isopropyl, butyl, isobutyl, tbutyl, pentyl, hexyl, ethylhexyl, heptyl, octyl, nonyl, decyl, dodecyl, hexyadecyl, cyclohexyl, cyclopentyl, methoxy, ethoxy, butoxy, hexyloxy, ethylhexyloxy, methoxyethoxyethyl, methoxyethyloxyethoxyethyl, phenyl, tolyl, nathphyl, xylene, anthracene, phenanthrene, phenylmethylenephenyl, benzyl, phenoxy, pyridyl, thiophenyl. Preferably, $R_1$, $R_2$, $R_3$, $R_4$, and $R_5$ are hydrogen, t-butyl, phenyl, 2-ethylhexyloxy, or 4-methoxypheny.

Y represents one or more divalent linking group, and can be a substituted or unsubstituted alkyl, alkoxy, aryl, or heteroaryl groups. When more than one group is included the groups can be different.

Alkyl or alkoxy groups contain 1 to 28 carbon atoms;

Substituted or unsubstituted aryl groups contain 6 to 28 carbon atoms which include phenyl, biphenyl, naphthyl, anthracene, fluorene, phenanthrene, spirophenyl, perylene, or pyrene groups;

Substituted or unsubstituted heteroaryl groups contain 4 to 40 carbon atoms which include pyridine, thiophene, pyrrole, bithiophene, furan, benzofuran, benzimidazole, benzoxazole, quinoxaline, phenylquinoline, dipheyloxadizaole, or carbazole;

All the substituents mentioned above include alkyl or alkoxy groups containing 1 to 24 carbon atoms, aryl or substituted aryl containing 6 to 28 carbon atoms; or heteroaryl or substituted heteroaryl containing 4 to 40 carbons; or F, Cl, Br; or cyano group; or nitro group.

Y can include one or more of the following groups:

Group I:

Y are alkyl or alkoxy groups of formula (II):

—R—   (II)

wherein:

R contains 1 to 24 carbon atoms, may also contains N, S, F, Cl, Br, or Si atoms.

The following molecular structures constitute specific examples of alkyl or alkoxy groups

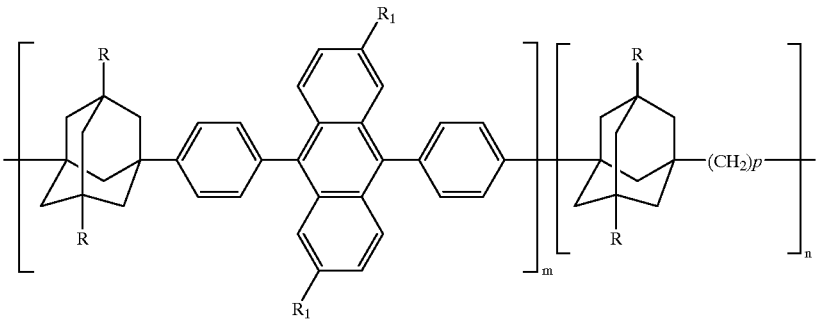

polymer 1 R=H, $R_1$=2-ethylhexyloxy, p=12 polymer 2 R=Ph, $R_1$=2-ethylhexyloxy, p=12 polymer 3 R=n-hexyl, $R_1$=2-ethylhexyloxy, p=12 polymer 4 R=n-hexyl, $R_1$=t-butyl, p=12 polymer 5 R=H, $R_1$=2-ethylhexyloxy, p=6

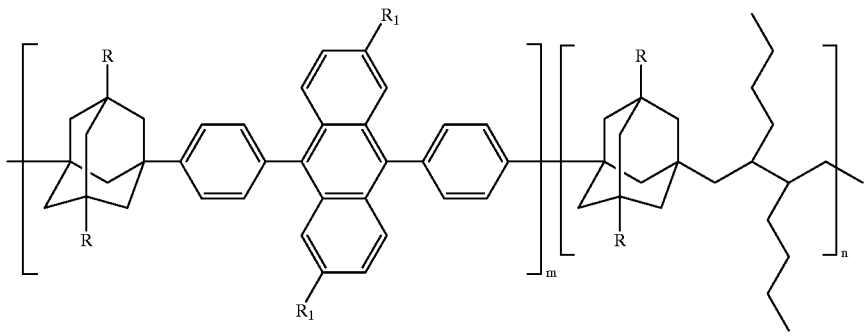
polymer 6 R=H, R₁=2-ethylhexyloxy
polymer 7 R=H, R₁=2-ethylhexyl
polymer 8 R=n-hexyl, R₁=t-butyl
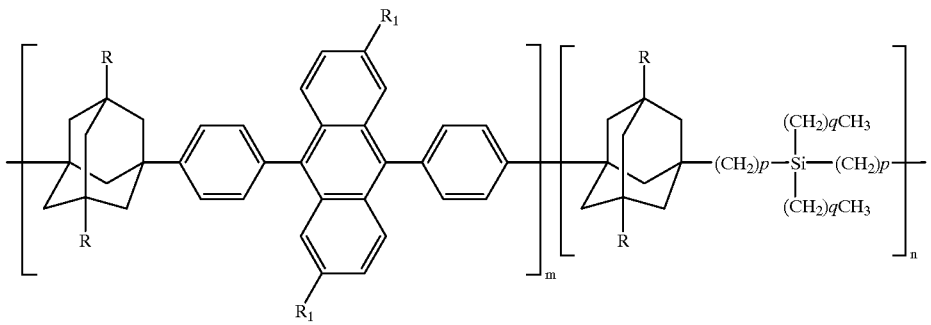
polymer 9 R₁=H, R₂=2-ethylhexyloxy, p=4, q=3
polymer 10 R₁=n-hexyl, R₂=t-butyl, p=4, q=3
polymer 11 R₁=n-hexyl, R₂=t-butyl, p=4, q=5
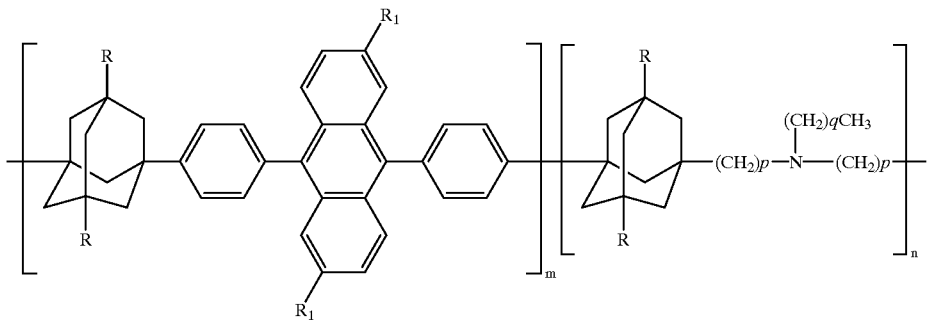
polymer 12 R=H, R₁=2-ethylhexyloxy, p=4, q=3
polymer 13 R=phenyl, R₁=2-ethylhexyl, p=4, q=5
polymer 14 R=n-hexyl, R₁=2-ethylhexyloxy, p=4, q=5

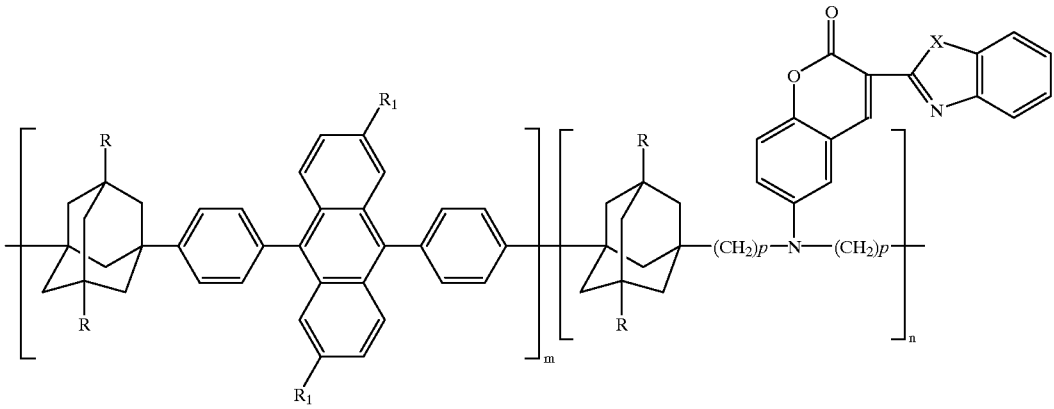

polymer 15 R=H, R₁=2-ethylhexyloxy, X=O, p=6
polymer 16 R=n-hexyl, R₁=2-ethylhexyloxy, X=O, p=4
polymer 17 R=2-ethylhexyl, R₁=t-butyl, X=S, p=4

Group II:
Y are two aryl groups connected by a linking group X of formula (III)

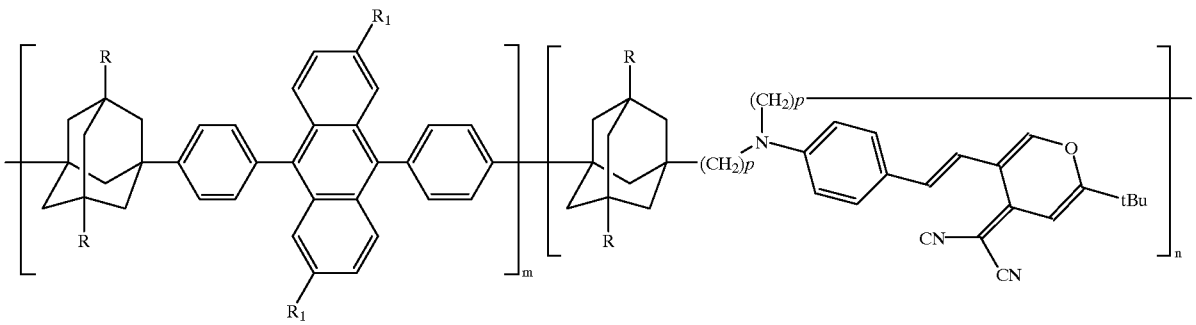

polymer 18 R=H, R₁=2-ethylhexyloxy, p=6
polymer 19 R=n-hexyl, R₁=2-ethylhexyloxy, p=4
polymer 20 R=2-ethylhexyl, R₁=t-butyl, p=4

$$—(Ar_1)—X—(Ar_2)— \quad (III)$$

wherein:

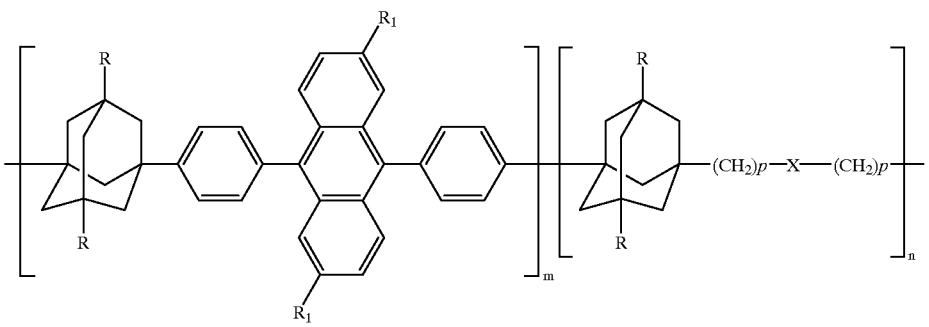

polymer 21 R=H, R₁=2-ethylhexyloxy, p=12, X=O
polymer 22 R=n-hexyl, R₁=hexyl, p=6, X=O
polymer 23 R=H, R₁=2-ethylhexyloxy, p=6, X=SO₂
polymer 24 R=H, R₁=2-ethylhexyloxy, p⁴, X=SO₂
polymer 25 R=n-hexyl, R₁=n-hexyl, p=4, X=SO₂
polymer 26 R=4-methoxyphenyl, R₁=2-ethylhexyloxy, p=4, X=SO₂

$Ar_1$ and $Ar_2$ are substituted or unsubstituted aryl groups containing 6 to 28 carbon atoms; and X are divalent linking groups containing 0 to 12 carbon atoms, can contain N, Si, O, Cl, F, Br, or S atoms.

The following molecular structures constitute specific examples of above mentioned groups with formula III:

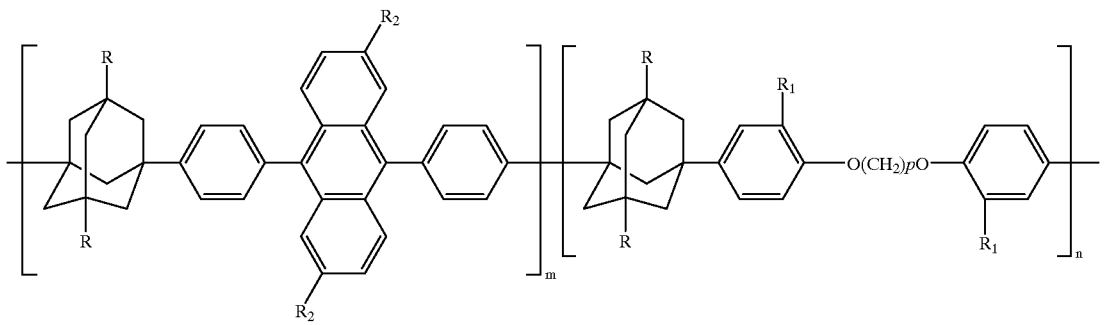

polymer 27 R=R$_1$=H, R$_2$=2-ethylhexyloxy, p=6
polymer 28 R=R$_1$=H, R$_2$32 2-ethylhexyloxy, p=12
polymer 29 R=n-hexyl, R$_1$=R$_2$=H, p=12

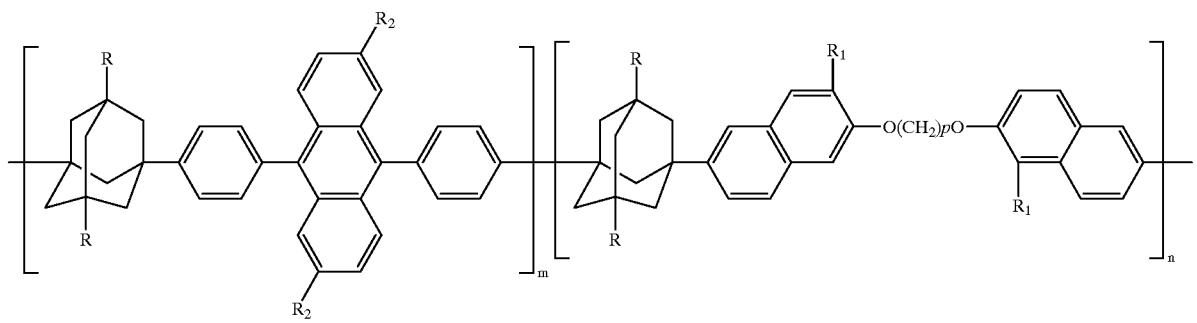

polymer 30 R=R$_1$=H, R$_2$=2-ethylhexyloxy, p=6
polymer 31 R=R$_1$=H, R$_2$=2-ethylhexyloxy, p=12
polymer 32 R=n-hexyl, R$_1$=R$_2$=H, p=12
polymer 33 R=phenyl, R$_1$=n-hexyl, R$_2$=t-butyl, p=6 polymer 34 R=H, X=C, R$_1$=CH$_3$, R$_2$=2-ethylhexyloxy
polymer 35 R=H, X=C, R$_1$=CF$_3$, R$_2$=2-ethylhexyloxy
polymer 36 R=phenyl, X=C, R$_1$=CF$_3$, R$_2$=2-ethylhexyloxy

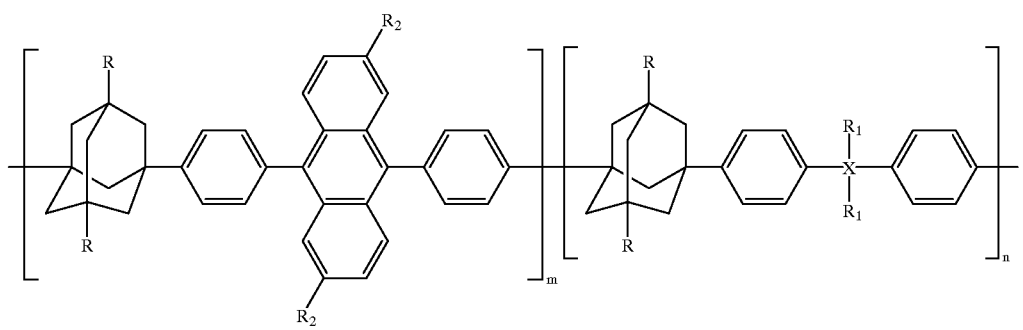

polymer 37 R=H, X=Si, R$_1$=CH$_3$, R$_2$=2-ethylhexyloxy
polymer 38 R=n-hexyl, X=Si, R=n-butyl, R$_2$=t-butyl

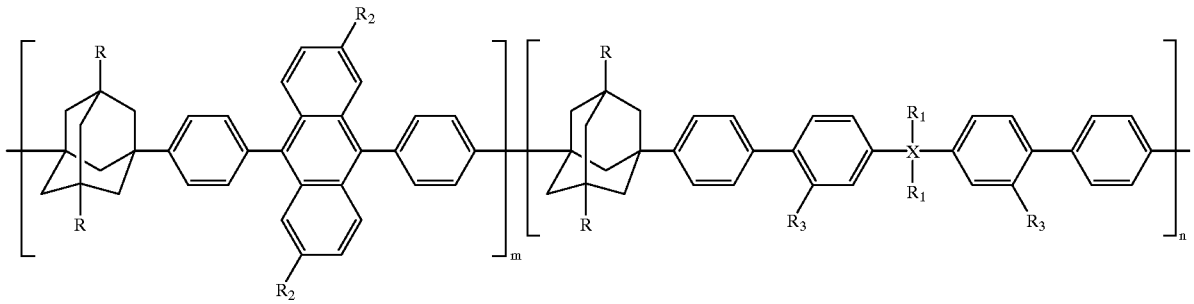

polymer 39 R=R₃=H, X=C, R₁=CH₃, R₂=2-ethylhexyloxy
polymer 40 R=R₃=H, X=C, R₁=CF₃, R₂=2-ethylhexyloxy
polymer 41 R=phenyl, X=C, R₁=CF₃, R₂=2-ethylhexyloxy, R₃=n-hexyl
polymer 42 R=R₃=H, X=Si, R₁=CH₃, R₂=2-ethylhexyloxy
polymer 43 R=R₃=n-hexyl, X=Si, R₁=n-butyl, R₂=t-butyl polymer 50 R=R₂=H, R₁=2-ethylhexyoxy
polymer 51 R=n-hexyl, R₁=t-butyl, R₂=hexyloxy
polymer 52 R=phenyl, R₁=2-ethylhexyloxy R₂=hexyloxy

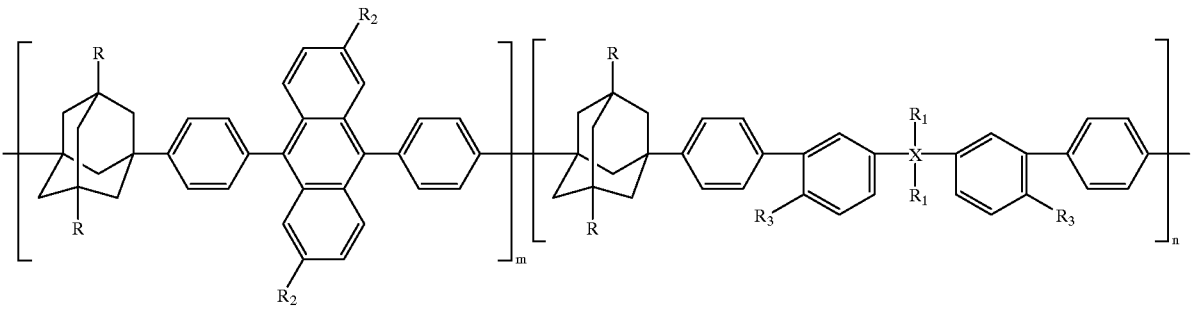

polymer 44 R=R₃=H, X=C, R₁=CH₃, R₂=2-ethylhexyloxy
polymer 45 R=R₃=H, X=C, R₁=CF₃, R₂=2-ethylhexyloxy
polymer 46 R=phenyl, X=C, R₁=CF₃, R₂=2-ethylhexyloxy, R₃=n-hexyl
polymer 47 R=H, X=C, R₃=methoxy, R₂=2-ethylhexyloxy both R₁ together to form 9,9-fluorene
polymer 48 R=R₃=H, X=Si, R₁=CH₃, R₂=2-ethylhexyloxy
polymer 49 R=R₃=n-hexyl, X=Si, R₁=n-butyl, R₂=t-butyl

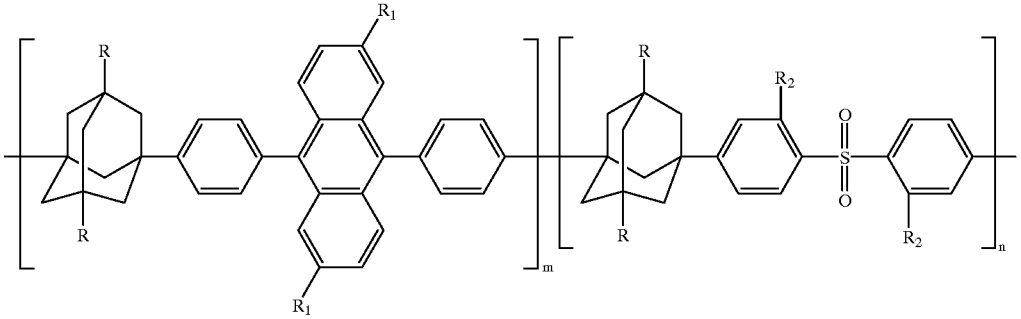

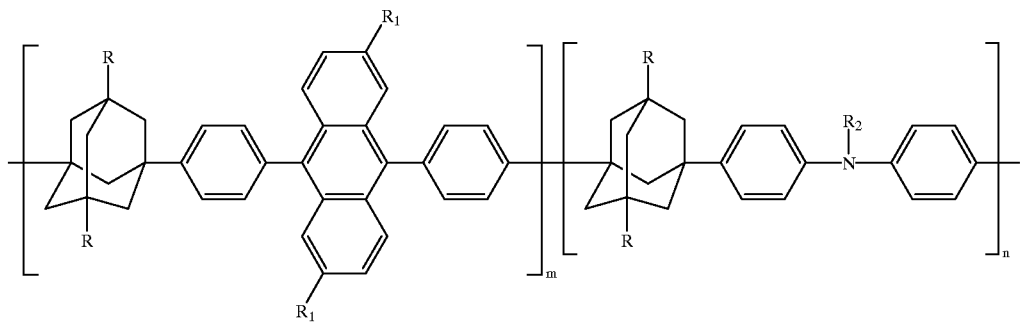

polymer 53 R=H, R₂=n-butyl, R₁=2-ethylhexyloxy
polymer 54 R=4-methoxyphenyl, R₂=n-butyl, R₁=2-ethylhexyl
polymer 55 R=H, R₁=t-butyl, R₂=2-ethylhexyl polymer 60 R=n-hexyl, R₁=t-butyl, R₂=2-ethylhexyl
polymer 61 R=4-methoxyphenyl, R₁=2-ethylhexyloxy, R₂=2-ethylhexyl

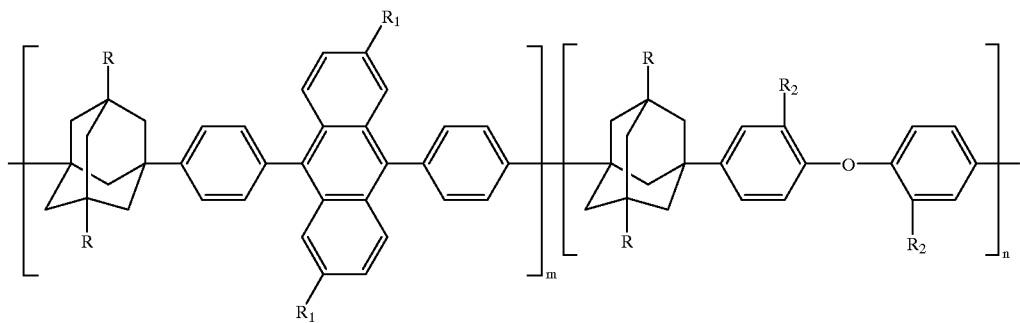

polymer 56 R=R₂=H, R₁=2-ethylhexyloxy
polymer 57 R=n-hexyl, R₁=t-butyl, R₂=H

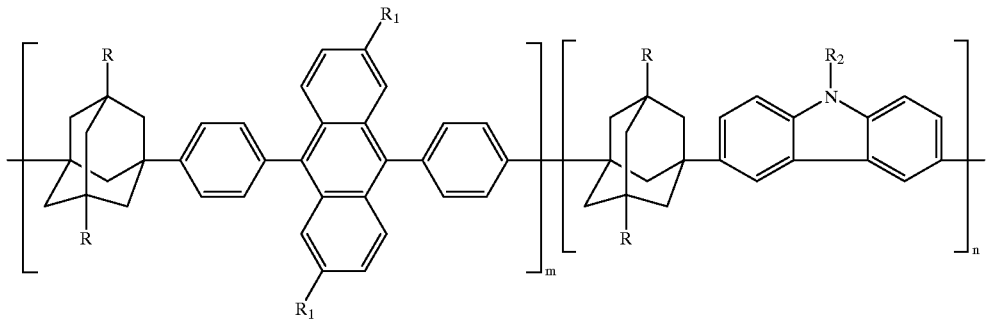

polymer 58 R=H, R₁=2-ethylhexyloxy, R₂=n-hexyl
polymer 59 R=phenyl, R₁=2-ethylhexyloxy, R₂=n-hexyl

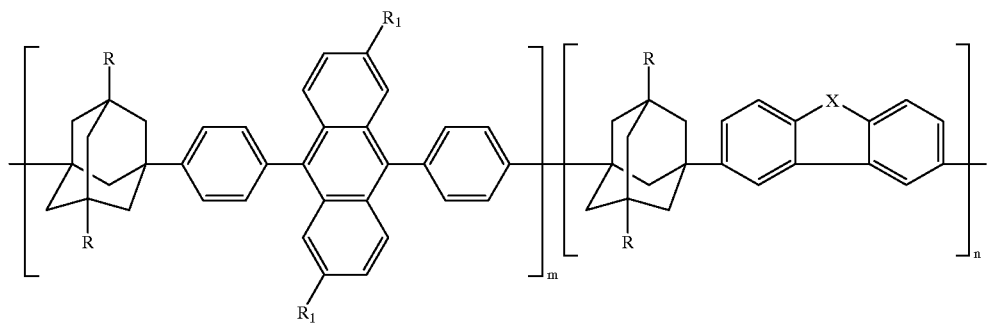

polymer 62 R=H, R₁=2-ethylhexyloxy, X=O
polymer 63 R=n-hexyl, R₁=2-ethylhexyloxy, X=O
polymer 64 R=n-hexyl, R₁=2-ethylhexyloxy, X=S polymer 68 R=H, R₁=2-ethylhexyloxy
polymer 69 R=n-hexyl, R₁=2-ethylhexyloxy
polymer 70 R=phenyl, R₁=2-ethylhexyloxy

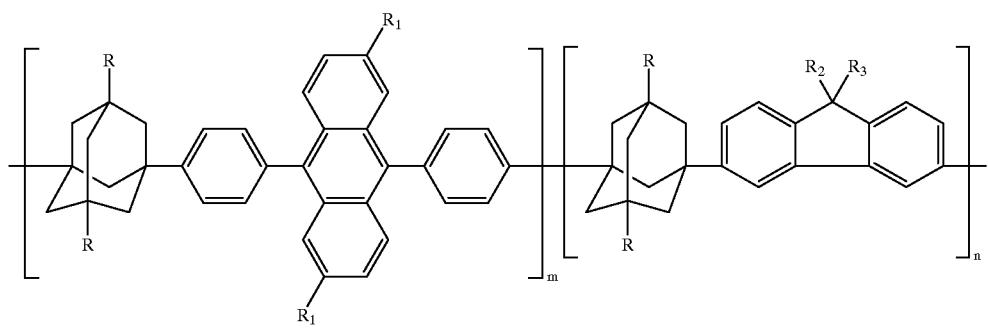

polymer 65 R=H, R₁=2-ethylhexyloxy, R₂=R₃=n-hexyl
polymer 66 R=H, R₁=2-ethylhexyloxy, R₂=R₃=phenyl
polymer 67 R=n-hexyl, R₁=2-ethylhexyloxy, R₂=R₃=4-methyoxyphenyl

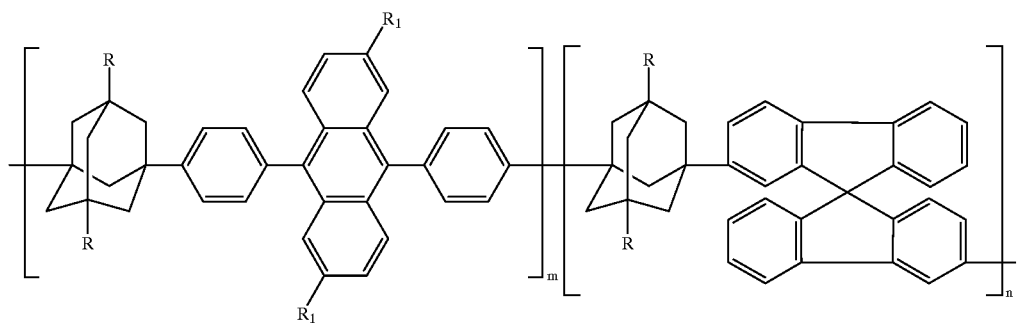

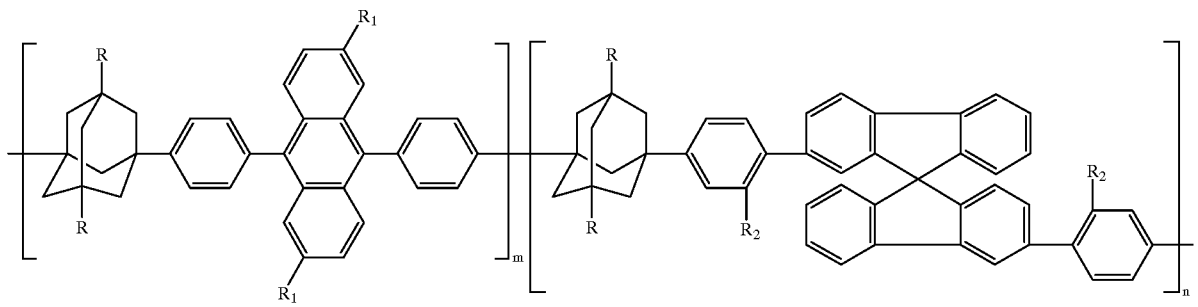

polymer 71 R=R₂=H, R₁=2-ethylhexyloxy
polymer 72 R=n-hexyl, R₁=2-ethylhexyloxy, R₂=n-hexyloxy Group III:
Y are aromatic hydrocarbons of formula (IV):

$$-(Ar)-\quad\quad (IV)$$

wherein:
Ar is substituted or unsubstituted aryl groups with 6 to 28 carbon atoms.

polymer 78 R=n-hexyl, R₁=t-butyl, R₂=H, R₃=n-hexyloxy
polymer 79 R=R₃=H, R₁=2-ethylhexyloxy, R₂=n-hexyloxy The following molecular structures constitute specific examples of above mentioned groups with formula IV:

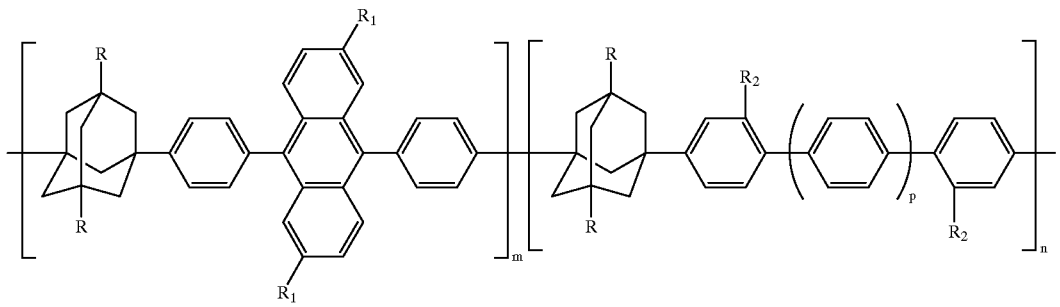

polymer 73 R=R₂=H, R₁=2-ethylhexyloxy, p=0
polymer 74 R=R₂=H, R₁=2-ethylhexyloxy, p=1
polymer 75 R=R₂=H, R₁=2-ethylhexyloxy, p=2
polymer 76 R=n-hexyl, R₁=t-butyl, R₂=n-hexyl, p=1

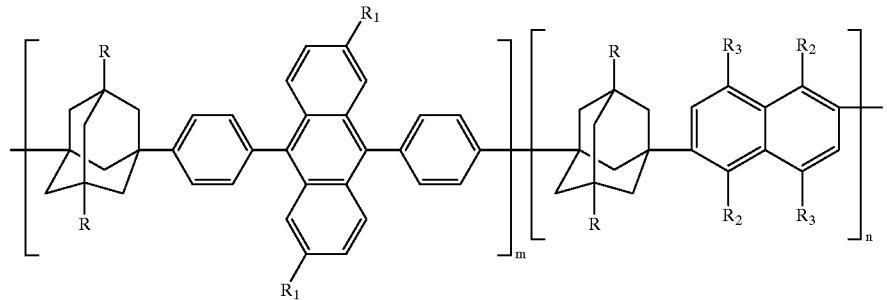

polymer 77 R=n-hexyl, R₁=t-butyl, R₂=n-hexyloxy, R₃=H

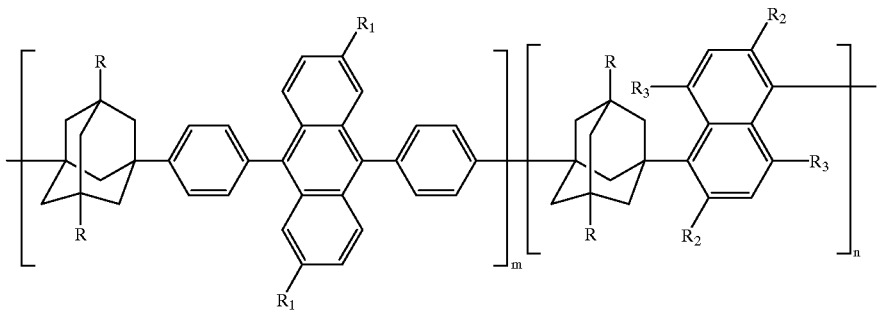

polymer 80 R=n-hexyl, R₁=t-butyl, R₂=n-hexyloxy, R₃=H
polymer 81 R=n-hexyl, R₁=t-butyl, R₂=H, R₃=n-hexyloxy
polymer 82 R=R₃=H, R₁=2-ethylhexyloxy, R₂=n-hexyloxy polymer 86 R=n-hexyl, R₁=t-butyl, R₂=n-hexyloxy, R₃=H
polymer 87 R=n-hexyl, R₁=t-butyl, R₂=H, R₃=n-hexyloxy
polymer 88 R=R₃=H, R₁=2-ethylhexyloxy, R₂=n-hexyloxy

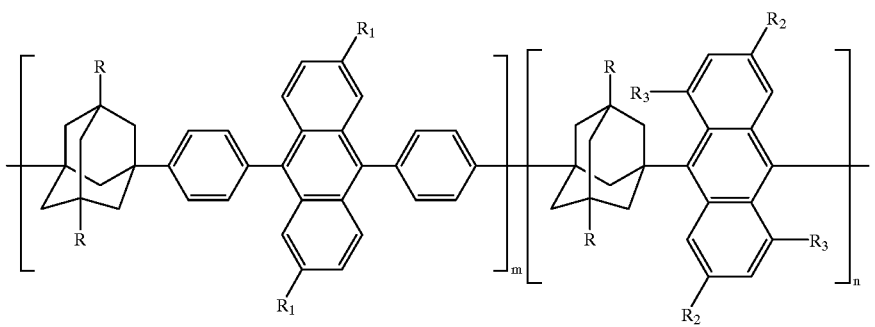

polymer 83 R=n-hexyl, R₁=t-butyl, R₂=n-hexyloxy, R₃=H
polymer 84 R=n-hexyl, R₁=t-butyl, R₂=H, R₃=n-hexyloxy
polymer 85 R=R₃=H, R₁=2-ethylhexyloxy, R₂=n-hexyloxy

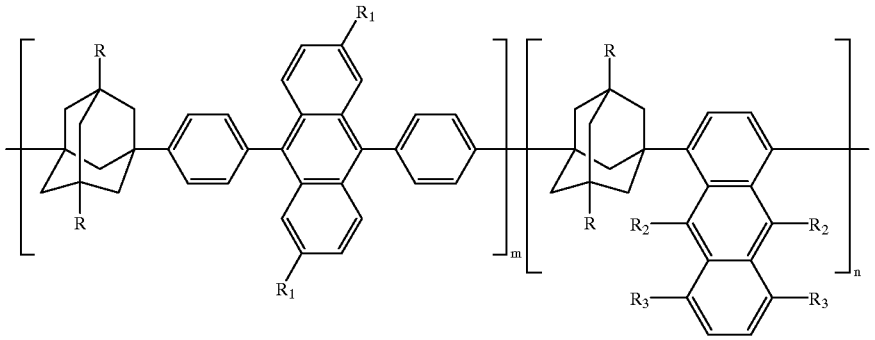

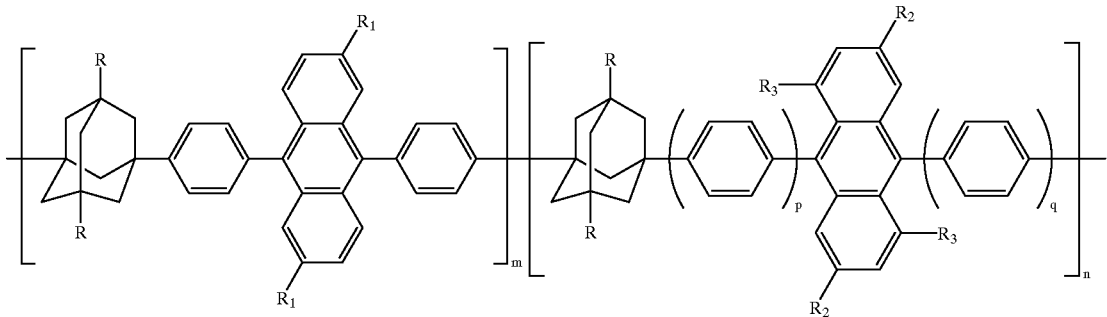

polymer 89 R=R₃=H, R₁=2-ethylhexyloxy, R₂=n-hexyloxy, p=q=1
polymer 90 R=R₁=R₂=R₃=H, p=q=1
polymer 91 R=R₃=H, R₁=R₂=t-butyl, p=q=1
polymer 92 R=R₃=H, R₁=R₂=2-ethylhexyloxy, p=q=1
polymer 93 R=n-hexyl, R₁=2-ethylihexyloxy, R₂=n-hexyloxy, R₃=H, p=q=2
polymer 94 R=n-hexyl, R₁=2-ethylhexyloxy, R₂=n-hexyloxy, R₃=H, p=1, q=2 polymer 98 R=R₂=H, R₁=2-ethylhexyloxy
polymer 99 R=H, R₁=2-ethylhexyloxy, R₂=n-hexyl
polymer 100 R=R₂=n-hexyl, R₁=t-butyl

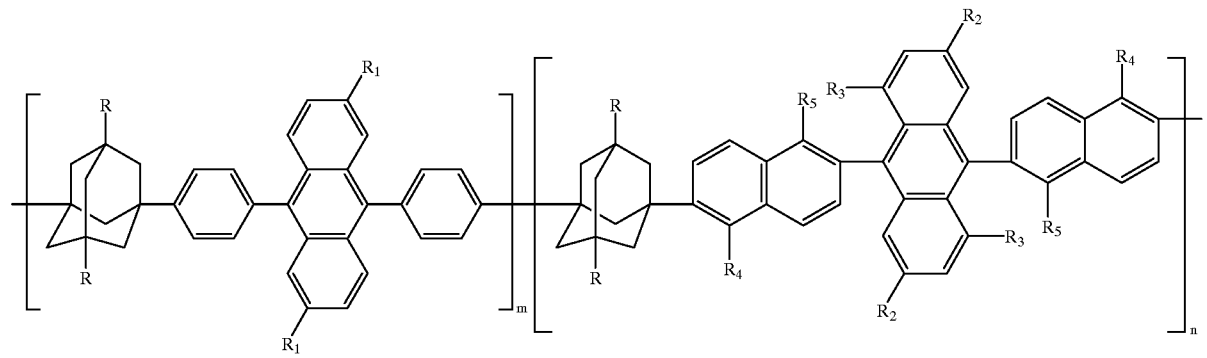

polymer 95 R=R₂=R₄=R₅=H, R₁=R₃=2-ethylhexyloxy
polymer 96 R=R₃=R₅=H, R₄=n-hexyloxy, R₁=R₂=2-ethylhexyloxy
polymer 97 R=R₄=n-hexyl, R₁=R₂=2-ethylhexyl, R₃=R₄=R₅=H

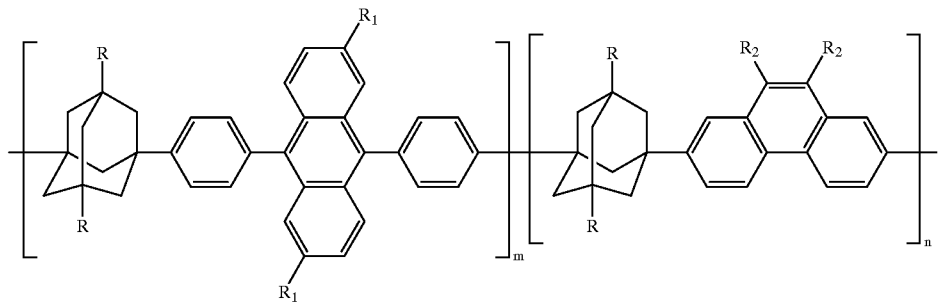

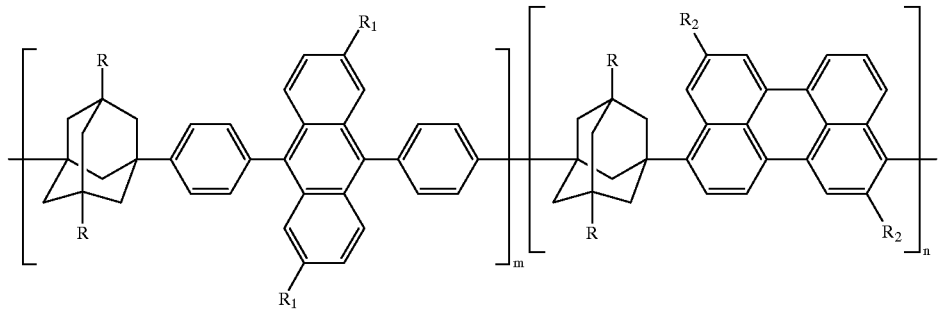

polymer 101 R=$R_2$=H, $R_1$=2-ethylhexyloxy polymer
polymer 102 R=H, $R_1$=2-ethylhexyloxy, $R_2$=n-hexyl
polymer 103 R=$R_2$=n-hexyl, $R_1$=t-butyl

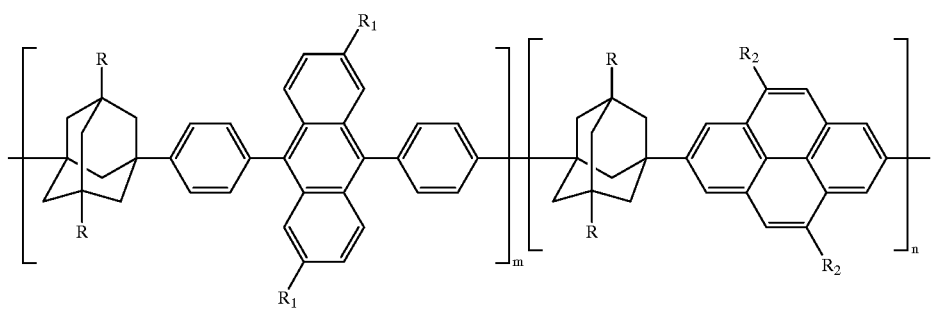

polymer 104 R=$R_2$=H, $R_1$=2-ethylhexyloxy
polymer 105 R=H, $R_1$=2-ethylhexyloxy, $R_2$=n-hexyl
polymer 106 R=$R_2$=n-hexyl, $R_1$=t-butyl

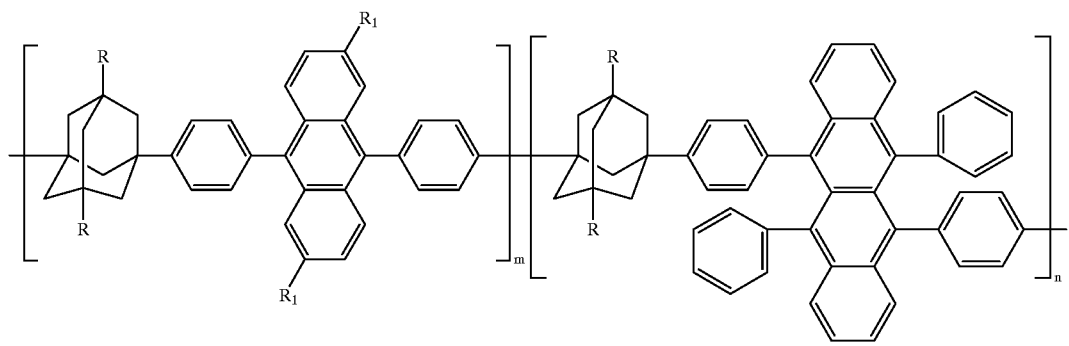

polymer 107 R=H, $R_1$=2-ethylhexyloxy
polymer 108 R=n-hexyl, $R_1$=2-ethylhexyloxy
polymer 109 R=4-hexylphenyl, $R_1$=2-ethylhexyloxy
polymer 110 R=4-dodecylphenyl, $R_1$=t-butyl Group IV:

Y are aromatic hydrocarbons linked by a double bond of formula (V)

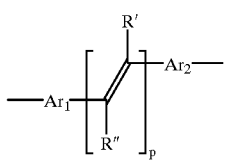

(V)

wherein:

Ar₁ and Ar₂ are substituted or unsubstituted aryl groups with 6 to 28 carbon atoms;

R' and R" are hydrogen, alkyl group containing 1 to 12 carbon atoms, or Cl, Br, F, or CN groups; and p is an integer from 1 to 3

The following molecular structures constitute specific examples of above mentioned groups with formula IV:

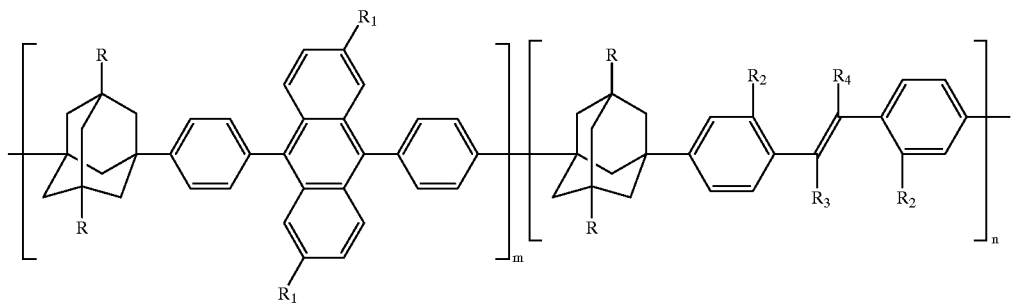

polymer 111 R=$R_2$=$R_3$=H, $R_1$=2-ethylhexyloxy, $R_4$=CN polymer 112 R=n-hexyl, $R_1$=2-ethylhexyloxy, $R_2$=$R_3$=$R_4$=H polymer 113 R=$R_2$=n-hexyl, $R_1$=2-ethylhexyloxy, $R_3$=H, $R_4$=CN polymer 115 R=$R_3$=$R_5$=H, $R_1$=2-ethylhexyloxy, $R_2$=n-hexyl, $R_4$=CN polymer 116 R=$R_3$=$R_5$=H, $R_1$=2-ethylhexyloxy, $R_2$=n-hexyloxy, $R_4$=CN polymer 117 R=$R_2$=$R_3$=H, $R_1$=2-ethylhexyloxy, $R_4$=CN, $R_2$=n-hexyloxy, $R_5$=n-hexyl polymer 118 R=$R_2$=$R_3$=H, $R_1$=2-ethylhexyloxy, $R_4$=CN, $R_2$=n-hexyloxy, $R_5$=n-hexyloxy

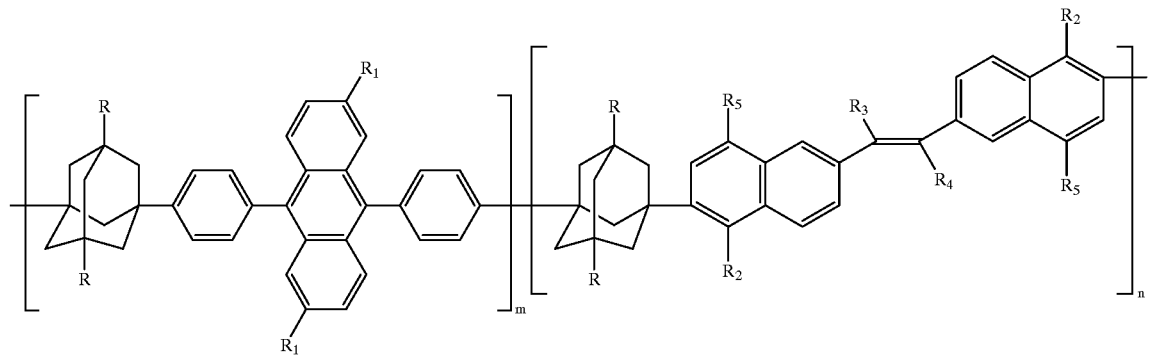

polymer 114 R=$R_3$=$R_4$=$R_5$=H, $R_1$=2-ethylhexyloxy, $R_2$=n-hexyl

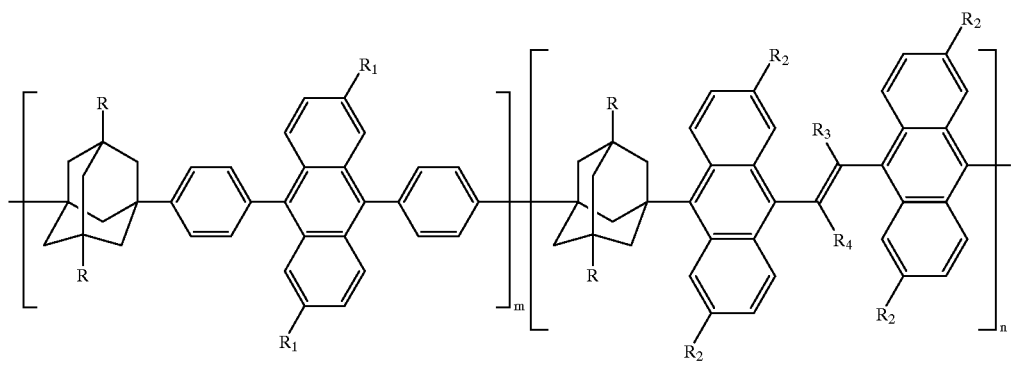

polymer 119 R=R₃=R₄=H, R₁=2-ethylhexyloxy, R₂=n-hexyl, polymer 120 R=R₃=H, R₁=2-ethylhexyloxy, R₂=n-hexyloxy, R₄=CN polymer 121 R=n-hexyl, R₁=t-Bu, R₂=2-ethylhexyloxy, R₃=H, R₄=CN polymer 130 R=R₂=H, R₁=2-ethylhexyloxy, R₃=CN, R₄=n-hexyloxy, p=q=2, r=1 polymer 131 R=n-hexyl, R₁=2-ethylhexyloxy, R₂=H, R₃=CN, R₄=n-hexyloxy, p=q=2, r=1

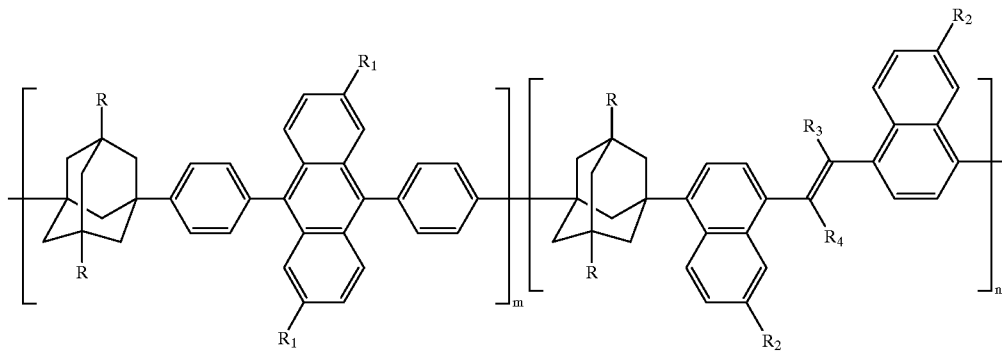

polymer 122 R=R₃=R₄=H, R₁=2-ethylhexyloxy, R₂=n-hexyl, polymer 123 R=R₃=H, R₁=2-ethylhexyloxy, R₂=n-hexyloxy, R₄=CN polymer 124 R=n-hexyl, R₁=t-butyl, R₂=2-ethylhexyloxy, R₃=H, R₄=CN polymer 125 R=n-hexyl, R₁=t-Bu, R₂=2-ethylhexyloxy, R₃=R₄=H,

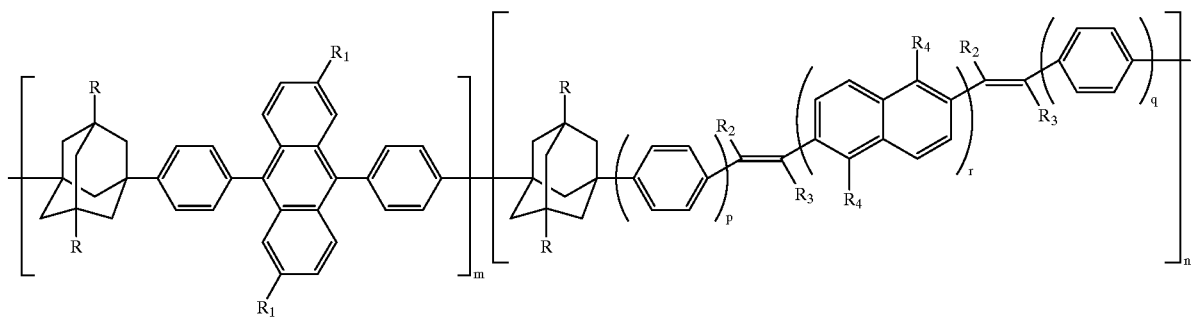

polymer 126 R=R₂=R₃=H, R₁=2-ethylhexyloxy, R₄=n-hexyl, p=q=r=1 polymer 127 R=R₂=H, R₁=2-ethylhexyloxy, R₃=CN, R₄=n-hexyl, p=q=r=1 polymer 128 R=R₂=R₃=H, R₁=2-ethylhexyloxy, R₄=n-hexyl, p=q=2, r=1 polymer 129 R=R₂=R₃=H, R₁=2-ethylhexyloxy, R₄=n-hexyloxy, p=q=2, r=1

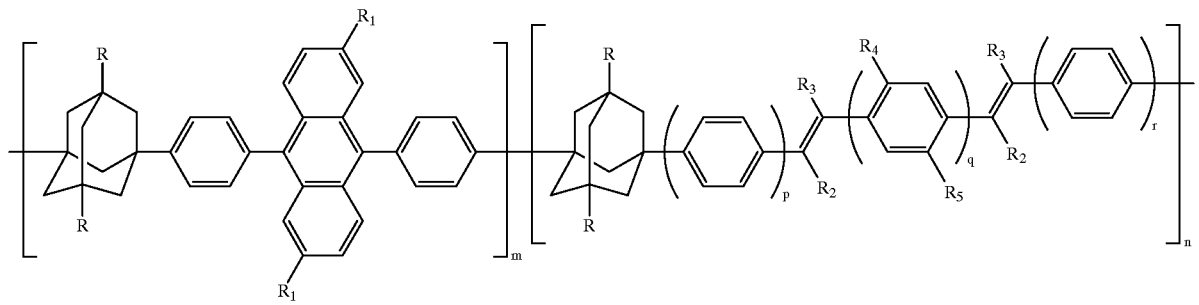

polymer 132 R=R$_2$=R$_3$=H, R$_1$=2-ethylhexyloxy, R$_4$=R$_5$=n-hexyl, p=q=r=1 polymer 133 R=R$_2$=H, R$_1$=2-ethylhexyloxy, R$_3$=CN, R$_4$=R$_5$=n-hexyl, p=q=r=1 polymer 134 R=R$_2$=R$_3$=H, R$_1$=2-ethylhexyloxy. R$_4$=R$_5$=n-hexyl, p=r=2, q=1 polymer 135 R=R$_2$=R$_3$=H, R$_1$=2-ethylhexyloxy, R$_4$=methoxy, R$_5$=3,7-dimethyloctyloxy, p=r=2, q=1 polymer 136 R=R$_2$=R$_3$=H, R$_1$=2-ethylhexyloxy, R$_4$=R$_5$=n-hexyloxy, p=q=r=2

Group V:

Y are hetcroaromatics of formula (VI)

$$-(W)-\qquad\qquad (VI)$$

wherein:

W is substituted or unsubstituted heteroaryl groups with 4 to 40 carbon atoms, and at least one or more N, S, or O atoms.

The following molecular structures constitute specific examples of above mentioned groups with formula VI:

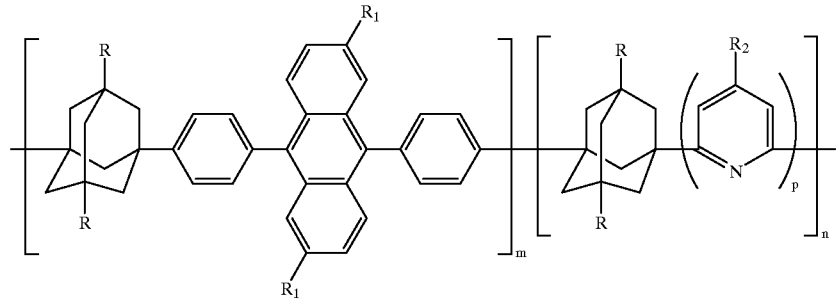

polymer 137 R=R$_2$=H, R$_1$=2-ethylhexyloxy, p=1
polymer 138 R=H, R$_1$=2-ethylhexyloxy, R=n-hexyl, p=1
polymer 139 R=H, R$_1$=2-ethylhexyloxy, R$_2$=n-hexyl, p=2
polymer 140 R=R$_2$=n-hexyl, R$_1$=t-butyl, p=2

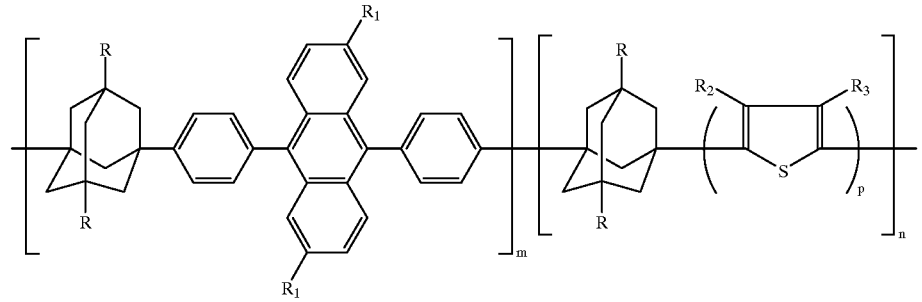

polymer 141 R=R₂=R₃=H, R₁=2-ethylhexyloxy, p=1 polymer 142 R=R₃=H, R₁=2-ethylhexyloxy, R₂=n-hexyl, p=1 polymer 143 R=H, R₂=R₃=n-hexy, R₁=2-ethylhexyloxy, p=2 polymer 151 R=H, R₁=2-ethylhexyloxy, p=q=1, X=O polymer 152 R=H, R₁=2-ethylhexyloxy, p=q=1, X=S polymer 153 R=H, R₁=2-ethylhexyloxy, p=q=1, X=N-hexyl-n polymer 154 R=n-hexyl, R₁=2-ethylhexyl, p=q=2, X=O

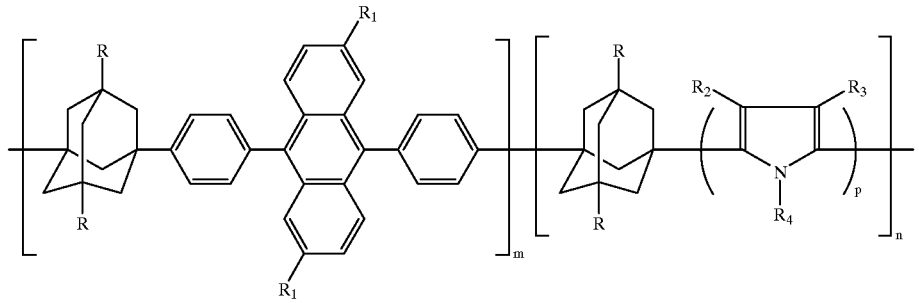

polymer 144 R=R₂=R₃=H, R₁=2-ethylhexyloxy, R₄=n-hexyl, p=1 polymer 145 R=R₃=H, R₁=2-ethylhexyloxy, R₂=n-hexyl, R₄=n-butyl, p=1 polymer 146 R=H, R₁=2-ethylhexyloxy, R₂=R₃=n-hexyl, R₄=n-propyl, p=2 polymer 155 R=n-hexyl, R₁=2-ethylhexyl, p=q=2, X=S polymer 156 R=n-hexyl, R₁=2-ethylhexyl, p=q=2, X=N-hexyl-n

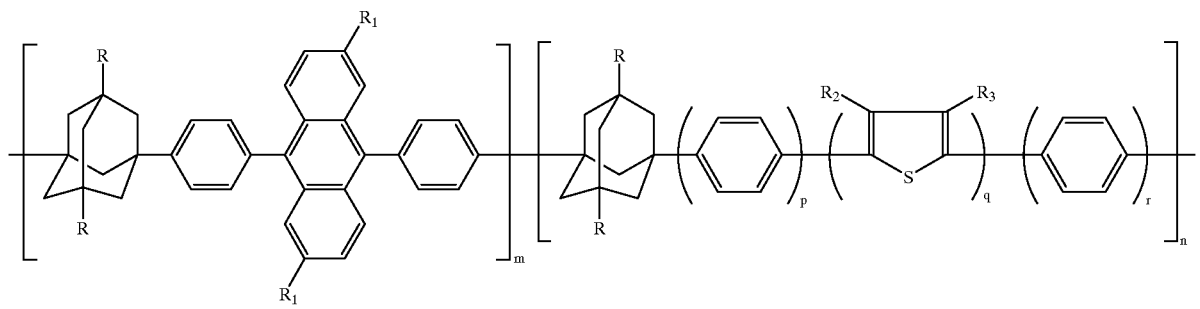

polymer 147 R=R₂=R₃=H, R₁=2-ethylhexyloxy, p=q=r=1 polymer 148 R=R₂=R₃=H, R₁=2-ethylhexyloxy, p=r=1, q=2 polymer 149 R=R₃=H, R₁=2-ethylhexyloxy, R₂=n-hexyl, p=q=r=1 polymer 150 R=H=R₂=R₃=n-hexyl, R₁=2-ethylhexyloxy, p=q=r=2

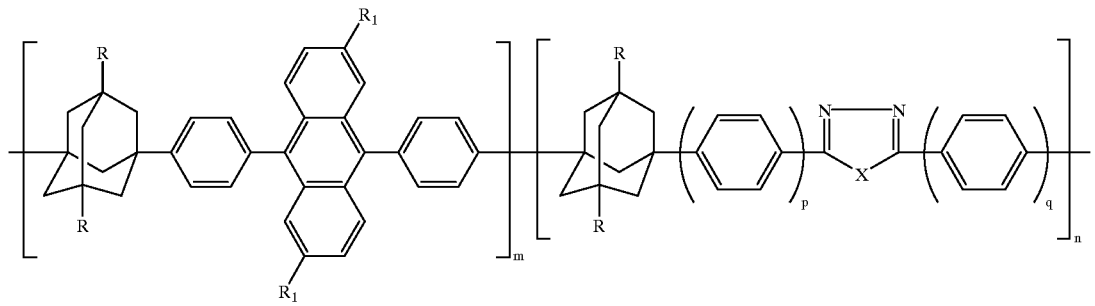

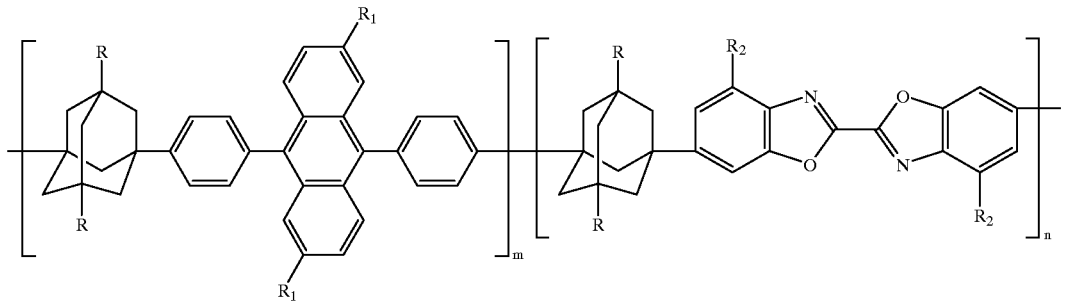

polymer 157 R=R$_2$=H, R$_1$=2-ethylhexyloxy
polymer 158 R=H, R$_1$=2-ethylhexyloxy, R$_2$=phenyl
polymer 159 R=H, R$_1$=2-ethylhexyloxy, R$_2$=n-hexyl
polymer 160 R=R$_2$=n-hexyl, R$_1$=2-ethylhexyloxy

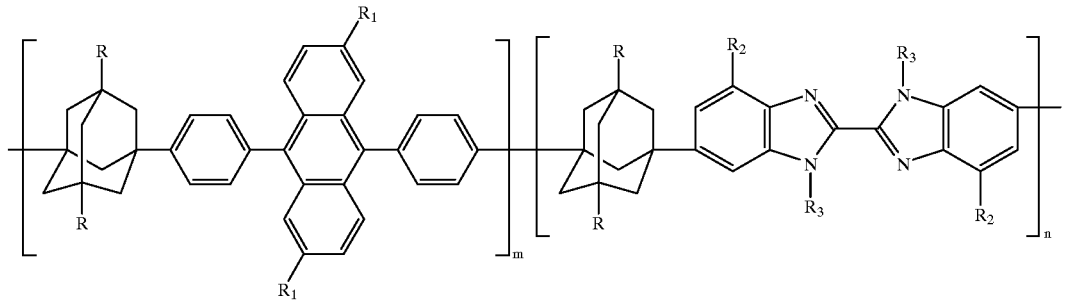

lp;2p polymer 161 R=R$_2$=R$_3$=H, R$_1$=2-ethylhexyloxy
polymer 162 R=H, R$_1$=2-ethylhexyloxy, R$_2$=R$_3$=phenyl
polymer 163 R=H, R$_1$=2-ethylhexyloxy, R$_2$=n-hexyl, R$_3$=4-methoxyphenyl
polymer 164 R=R$_2$=n-hexy, R$_1$=2-ethylhexyloxy, R$_3$=4-methoxyphenyl

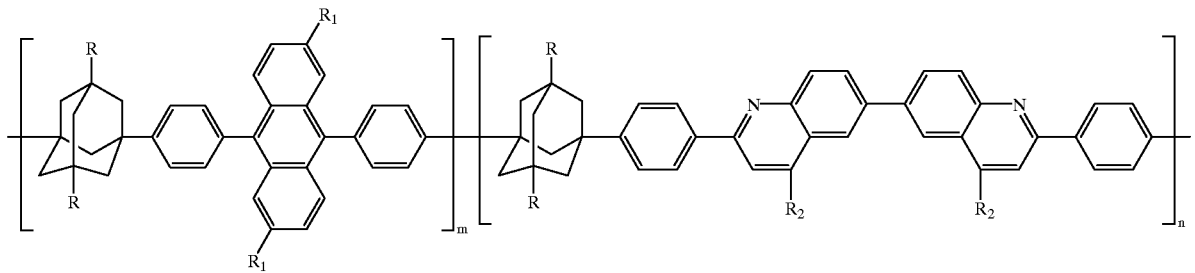

polymer 165 R=R$_2$=H, R$_1$=2-ethylhexyloxy
polymer 166 R=H, R$_1$=2-ethylhexyloxy, R$_2$=n-hexyl
polymer 167 R=H, R$_1$=2-ethylhexyloxy, R$_2$=phenyl
polymer 168 R=R$_2$=n-hexy, R$_1$=2-ethylhexyl

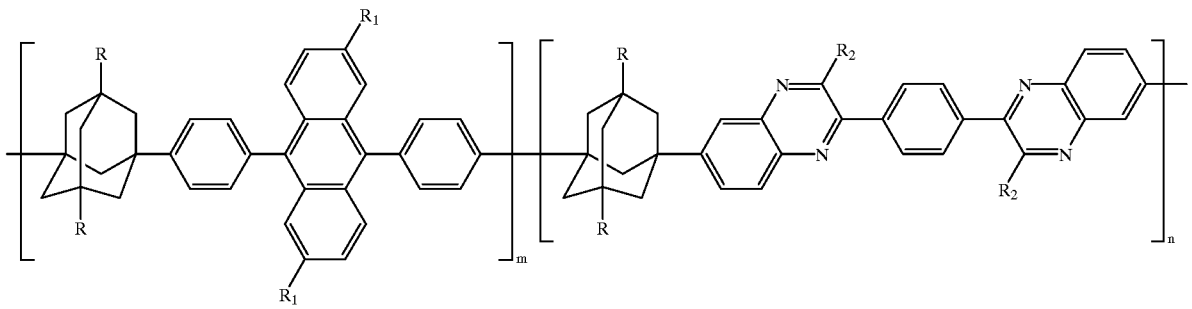

polymer 169 R=R$_2$=H, R$_1$=2-ethylhexyloxy
polymer 170 R=H, R$_1$=2-ethylhexyloxy, R$_2$=n-hexyl
polymer 171 R=H, R$_1$=2-ethylhexyloxy, R$_2$=phenyl
polymer 172 R=R$_2$=n-hexy, R$_1$=2-ethylhexyl

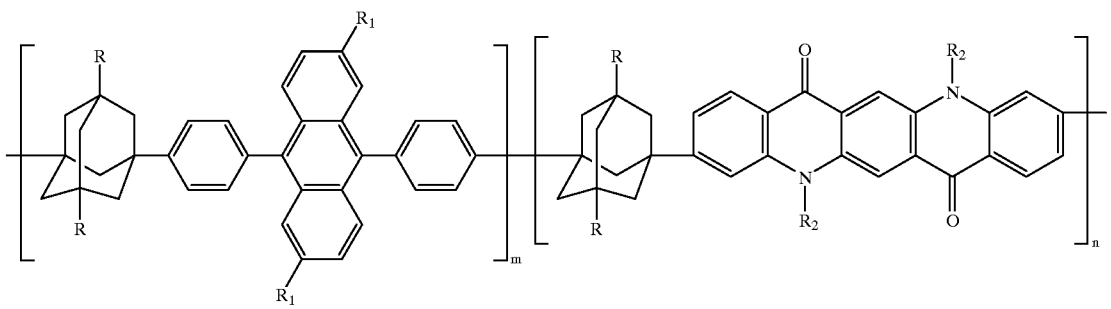

polymer 173 R=R$_2$=H, R$_1$=2-ethylhexyloxy
polymer 174 R=H, R$_1$=2-ethylhexyloxy, R$_2$=n-hexy
polymer 175 R=H, R$_1$=2-ethylhexyloxy, R$_2$=phenyl
polymer 176 R=R$_2$=n-hexy, R$_1$=2-ethylhexyl In formula (I), Y can be one or the combination of more than one of the above divided groups. The specific molecular structures can be the combination of any of the above drawn structures.

The polymerization method and the molecular weights of the resulting polymers used in the present invention are not necessary to be particularly restricted. The molecular weights of polymers are at least 1000, and preferably at least 3000. The polymers may be prepared by condensation polymerizations, preferably by cross-coupling reactions such as Pd-catalyzed Suzuki coupling (Miyaura, N. et al *Chem. Rev.* 1995, 95, 2457). Such a reaction was first reported by Suzuki et al on the coupling of aromatic boronic acid derivatives with aromatic halides (Suzuki, A. et al *Synthetic Comm.* 1981, 11(7), 513). Since then, this reaction has been widely used to prepared polymers for various applications (Ranger, M. et al *Macromolecules* 1997, 30, 7686–7691; Kim, S. et al *Macromolecules* 1998, 31, 964–974; and Ng, P. K *Macromol. Rapid Commun.* 1997, 18, 1009–1016). A modified process was reported by Inbasekaran et al to prepare conjugated polymers for EL devices (Inbasekaran, M. et al U.S. Pat. No. 5,777,070). According to the present invention, the above mentioned polymers were prepared by Suzuki coupling reaction of an aromatic diboronic acid ester with an aromatic dibromide. The aromatic diboronic acid esters were prepared from the corresponding dihalide treated with nBuLi and trimethylborate followed by esterification with a di-alcohol. The synthetic schemes for polymers and monomers are illustrated in Schemes 1–6.

FIG. 1 illustrates the basic structure used to construct organic EL devices. It is a bi-layer structure comprising a hole transport layer 30 and an electron transport layer 40. The electron transport layer 40 is also the emissive layer from which electroluminescence originates. Together they form the EL medium 50. The anode 20 is adjacent to the hole transport layer and the cathode 60 is adjacent to the electron transport layer 40. The substrate is layer 10. This figure is for illustration only and the individual layer thickness is not scaled according to the actual thickness.

Figure 2:
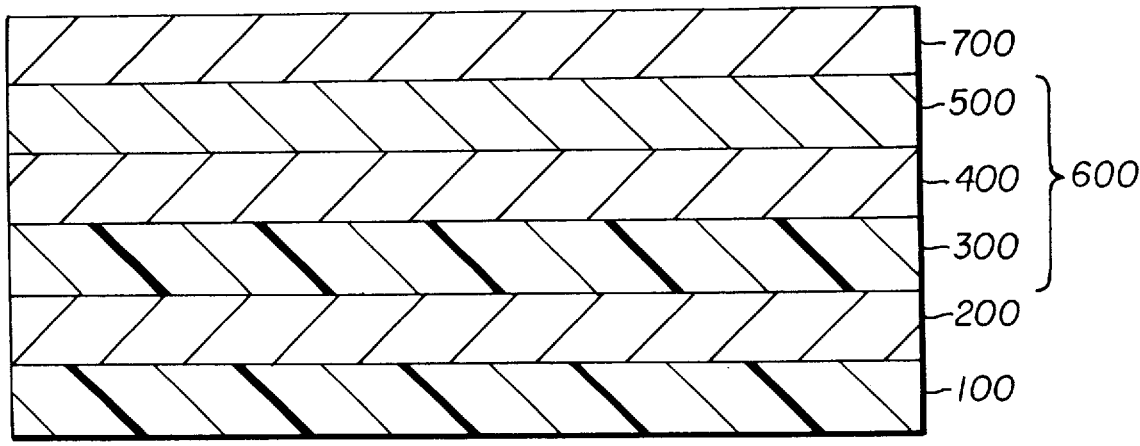
FIG. 2 illustrates a cross-section of a modified bi-layer EL device which can use a polymer in accordance with the present invention.

FIG. 2 illustrates an alternative construction of the EL device. It is a modified bi-layer structure. The EL medium contains an emissive layer between the hole transport layer and the electron transport layer. This emissive layer is the layer where electroluminescence originates. Thus, layer 300 is the hole transport layer, layer 400 is the emissive layer, layer 500 is the electron transport layer, and together they form the electroluminescent medium 600. Layer 200 is the anode and layer 700 is the cathode. The substrate is layer 100. This figure is for illustration only and the individual layer thickness is not scaled according to the actual thickness.

The bi-layer EL devices are the basic structure providing high luminous efficiency and low operating voltage. Alternative EL device structures have been demonstrated to provide improved device performance. These alternative structures include features in addition to the basic bi-layer structure such as the following structure (a) hole injection layer as disclosed in U.S. Pat. No. 4,356,429; (b) cathode modification with alkaline or alkaline halides as disclosed in U.S. Pat. No. 5,776,622; (c) anode modification with plasma-deposited fluorocarbons as disclosed in commonly-assigned U.S. patent application Ser. No. 09/191,705; and (d) doped emitter layer inserted between the hole transport and electron transport layer as disclosed in U.S. Pat. No. 4,769,292.

Figure 3:
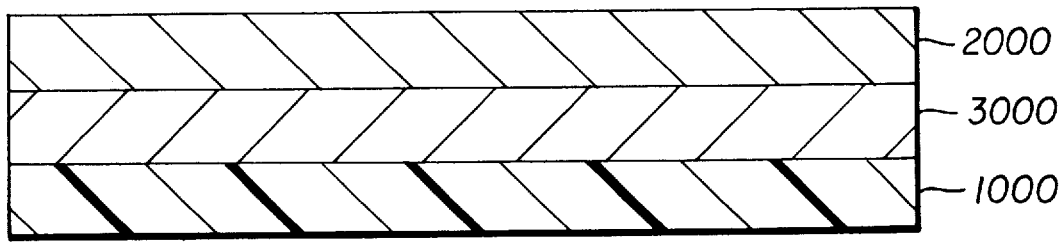
FIG. 3 illustrates a cross-section of a single-layer EL device which can use a polymer in accordance with the present invention.

FIG. 3 illustrates another alternative construction of an EL device. It is a single-layer structure comprising an emitting layer 3000, sandwiched between an anode 2000 and cathode 4000. The emitting layer 3000 also acts as a charge carrier layer. Thus, single layer 3000 is the electroluminescent medium. The substrate is layer 1000. This figure is for illustration only and the individual layer thickness is not scaled according to the actual thickness.

A preferred EL device structure of this invention is a single-layer structure comprising an anode, a cathode, and single layer of electroluminescent medium. This electroluminescent layer is the emissive layer, and is also capable of transporting electrons as well as holes. The principle function of this layer is to provide efficient emissive centers for electroluminescence. This layer can comprise one of the above mentioned polymers or the blend of two or more polymers, or polymers doped with one or more fluorescent dyes (FD). The fluorescent dye is usually present in an amount on the order of a few molar percent or less of the host polymer and it is sufficient to cause the EL emission to be predominantly that of the fluorescent dye. Using this method, highly efficient EL devices can be constructed. Simultaneously, the color of the EL devices can be tuned using fluorescent dyes of different emission wavelengths. By using a mixture of fluorescent dyes, EL color characteristics of the combined spectra of the individual fluorescent dyes are produced. This dopant scheme has been described in considerable detail for EL devices in U.S. Pat. No. 4,769, 292. An important criterion for choosing a fluorescent dye as a dopant capable of modifying the hue of light emission when present in a host material is a comparison of their energy bandgap. For efficient energy transfer from the host to the dopant molecule, a necessary condition is that the energy bandgap of the dopant is smaller than that of the host polymer. Preferred fluorescent dyes used as the dopant in the emissive layer include but are not limited to coumarins, stilbenes, distrylstibenes, anthracene derivatives, tetracene, perlenes, rhodamines, and arylamines.

The molecular structures of the preferred fluorescent dyes for the emissive layer in the EL device are listed as follows:

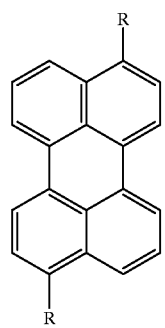

FD 1 R = H
FD 2 R = CO$_2$Pr-i

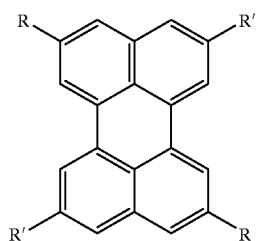

FD 3 R = H, R' = t-Bu
FD 4 R = R' = t-Bu

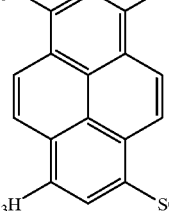

FD 5

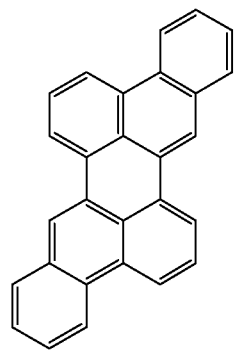

FD 6

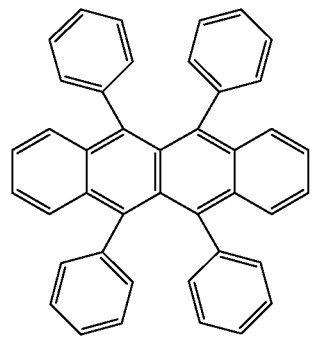

FD 7

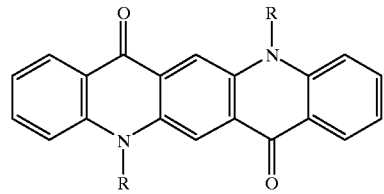

FD 8 R = H
FD 9 R = Me
FD 10 R = Pr-i
FD 11 R = 2-ethylhexyl

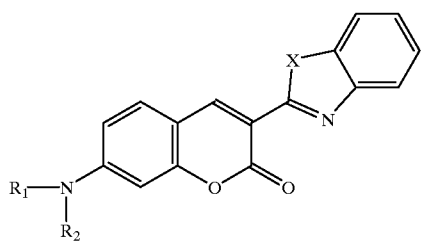

-continued

FD 12 R$_1$ = R$_2$ = Me, X = O
FD 13 R$_1$ = R$_2$ = hexyl, X = O
FD 14 R$_1$ = R$_2$ = phenyl, X = O
FD 15 R$_1$ = R$_2$ = Me, X = S
FD 16 R$_1$ = R$_2$ = hexyl, X = S
FD 17 R$_1$ = R$_2$ = phenyl, X = S

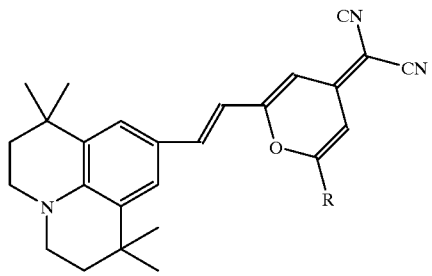

FD 18 R = n-hexyl
FD 19 R = phenyl

The above mentioned polymers can be deposited as high quality transparent thin filns by spin-coatinig or inkjet printing the polymer solutions. Preferably, the spin-coating technique is used to form layer 3000, and preferably, only one polymer is deposited as single layer of electroluminescent medium.

Preferred materials for use in forming the anode modified with fluorocarbons are disclosed in the above-cited U.S. patent application Ser. No. 09/191,705.

Preferred materials for use in forming the cathode of the EL devices of this invention are Mg, Li, or alloys of these materials as disclosed in U.S. Pat. No. 5,429,884 and 5,776,622.

EXAMPLES

The invention and its advantages are further illustrated by the following specific examples:

SYNTHESIS OF MONOMERS

Monomers to be used in the present invention are not necessary to be particularly restricted. Any monomers can be used as long as the polymer forned is a polymer which satisfies the general formula (I). Typical monomer and polymer synthesis is illustrated in Schemes 1–6.

Scheme 1

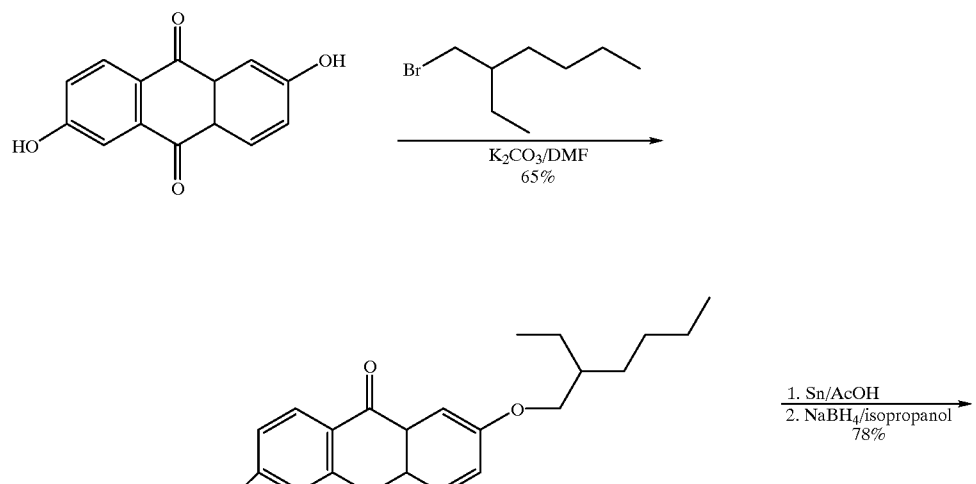

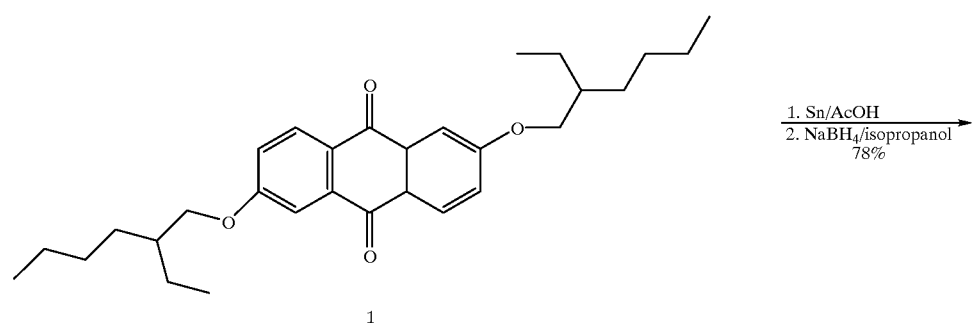

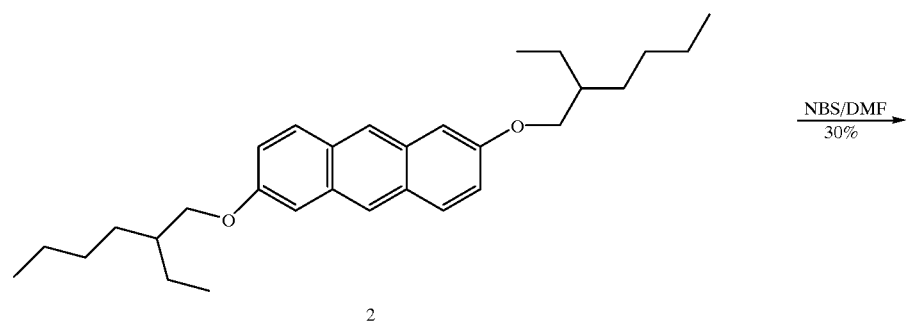

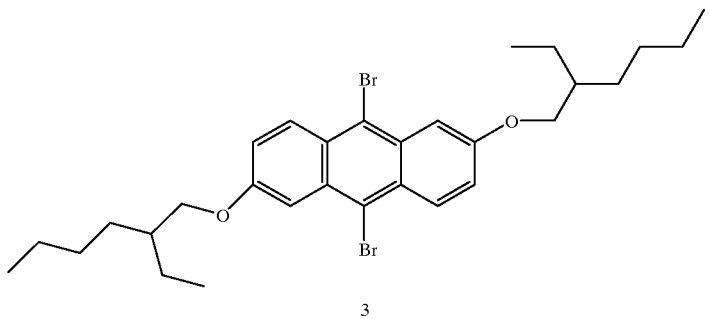
3
Scheme 2
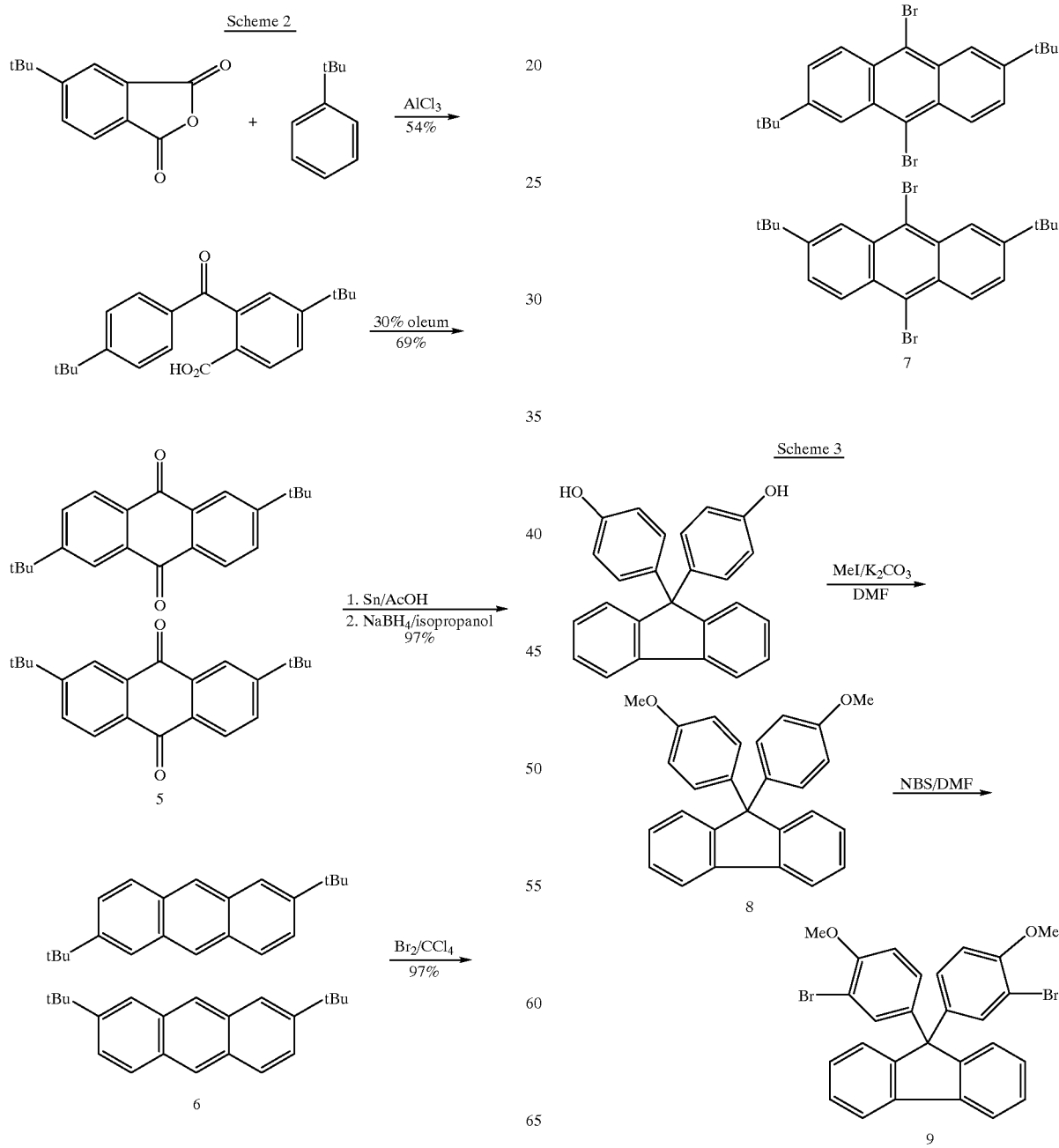

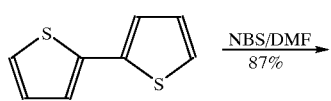
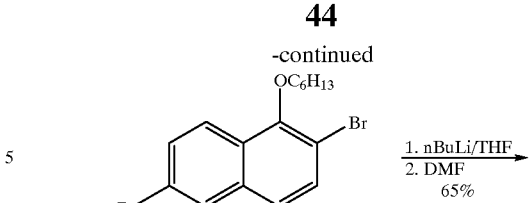
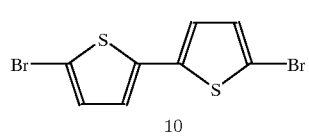
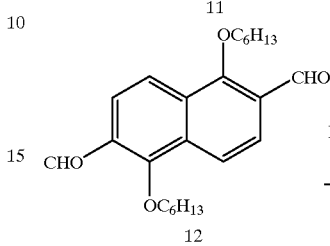
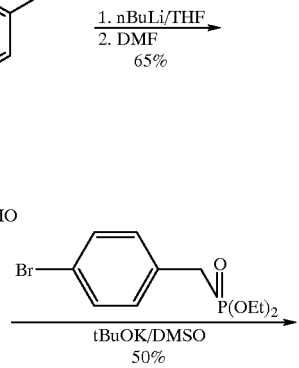
Scheme 4
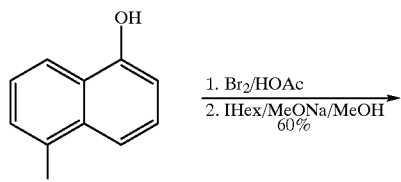
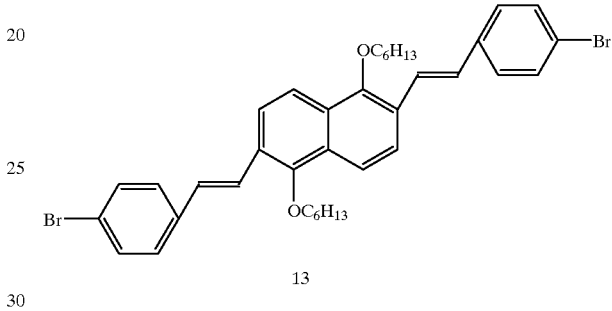
Scheme 5
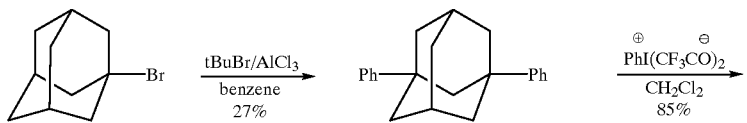
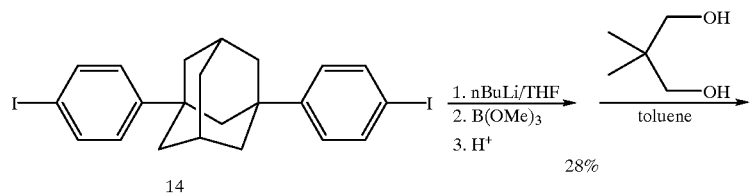
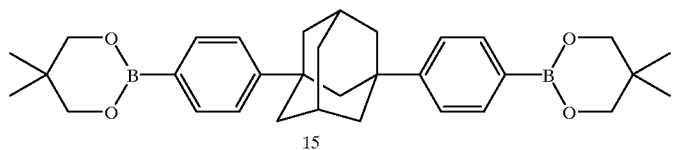

Scheme 6

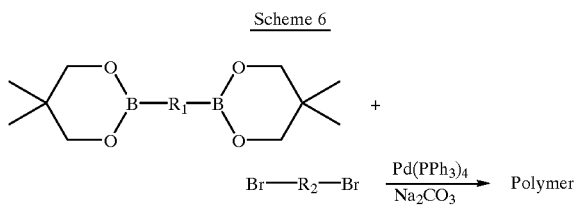

Example 1
Synthesis of 2,6-di(2-ethylhexyloxy)anthraquinone (compound 1)

2,6-Dibydroxyanthraquinone (100.0 g, 0.42 mol) and 2-ethylhexyl bromide (165.0 g, 0.86 mol) were dissolved in 1 L of DMF. To this solution was added anhydrous $K_2CO_3$ (120.0 g, 0.87 mol). The reaction was heated at 90° C. overnight. Most of DMF was removed and 500 mL of water was added. The reaction was extracted with ether (3×400 mL), washed with brine (1×200 mL), and dried over $MgSO_4$. Solvent was removed and the crude product was recrystallized from methanol to give yellow powdery product 125.21 g (65% yield). $^1H$ NMR ($CDCl_3$) δ (ppm): 0.92–0.98 (m, 12H, $CH_3$), 1.34–1.54 (m, 16H), 1.75–181 (m, 2H, C$\underline{H}$($CH_3$)), 4.02 (d, J=5.5 Hz, 4H, $OCH_2$), 7.19 (d, J=8.4 Hz, 2H), 7.70 (s, 2H), 8.19 (d, J=8.5 Hz, 2H); $^{13}C$ NMR ($CDCl_3$): 11.12, 14.06, 23.04, 23.88, 29.08, 30.51, 39.34, 71.34, 110.64, 120.84, 127.00, 129.62, 135.88, 164.29, 182.27. M.p. 49–51° C.; FD-MS: m/z 464 (M$^+$).

Example 2
Synthesis of 2,6-di(2-ethylhexyloxy)anthracene (compound 2)

To a 1 L round bottom flask was added 2,6-di(2-ethylhexyloxy)anthraquinone 1 (75.0 g, 0.16 mol), tin (80.0 g, 0.67 mol), and 375 mL of acetic acid. The reaction was refluxed for 2 h during which the reaction became a slurry. The reaction was cooled to room temperature and the top layer was decanted. The solid was washed with $CH_2Cl_2$. The combined organic phase was washed with water, saturated $NaHCO_3$ solution, and brine and dried over $MgSO_4$. Solvent was removed to yield 72.05 g of yellow solid. The yellow solid was dissolved in 200 mL of isopropanol and added dropwise to a solution of $NaBH_4$ (6.50 g, 0.17 mol) in 300 mL of isopropanol. The reaction was heated at reflux overnight. After cooled to room temperature, the reaction was quenched with dilute HCl solution and then poured into water. The yellow precipitate was collected by filtration, washed with water and ethanol and dried to give pure product was yellow powder 55.21 g (78% yield in two steps). $^1H$ NMR ($CDCl_3$) δ (ppm): 0.92–1.62 (m, 14H, alkyl), 1.79–1.87 (m, 1 H, alkyl), 3.99 (d, J=5.7 Hz, 2H, $OCH_2$), 7.14 (d, J=9.4 Hz, 2H), 7.17 (s, 2H, 1 and 5 of anthracene), 8.17 (s, 2H, 9 and 10 of anthracene); $^{13}C$ NMR ($CDCl_3$): 11.19, 14.10, 23.10, 24.07, 29.18, 30.72, 39.44, 70.48, 104.58, 120.85, 124.09, 128.71, 129.06, 131.30, 156.22. M.p. 60–62° C.; FD-MS: m/z 436 (M$^+$).

Example 3
Synthesis of 9,10-dibromo-2,6-di(2-ethylhexyloxy) anthracene (compound 3)

2,6-Di(2-ethylhexyloxy)anthracene 2 (13.50 g, 0.031 mol) was added to 150 mL of DMF and cooled down to 0° C. To this suspension was added NBS (11.60 g, 0.065 mol) in 60 mL of DMF. Upon the addition of NBS, the reaction became clear and turned to dark green color. The reaction was stirred at room temperature under nitrogen overnight. The reaction was poured into 200 ml of water, and extracted with methylene chloride (3×300 mL). The combined organic phase was washed thoroughly with water (3×100 mL) and brine (1×100 mL), and dried over $MgSO_4$. After removal of the solvent, the dark brown residue was washed with hexane to collect greenish yellow crystals. The crude crystals were recrystallized from acetone to give flake like greenish yellow fluorescent product. The filtrates were combined and purified by chromatography on silica gel with hexane as eluent. Total yield: 5.5 g (30% yield). $^1H$ NMR ($CDCl_3$) δ (ppm): 0.93–1.70 (m, 14H, alkyl), 1.81–1.89 (m, 1 H, alkyl), 3.12 (d, J=5.4 Hz, 2H, $OCH_2$), 7.34 (d, J=0.2 Hz, 2H), 8.00 (d, J=9.2 Hz, 2H), 8.71 (s, 1 and 5 of anthracene); $^{13}C$ NMR ($CDCl_3$): 11.12, 14.10,223.08, 23.93, 99.15, 30.52, 39.88, 72.76, 107.74, 117.02, 125.27, 129.51, 129.75, 130.12, 152.87. M.p. 103"105° C.; FD-MS: m/z 590 M$^+$).

Example 4
Synthesis of 4-t-butyl-2-benzoylbenzoic Acid (compound 4)

4-t-Butyl-phthalic anhydride (36.0 g; 176 mmol) and t-butyl benzene were placed under nitrogen in a 3-neck round-bottom flask equipped with a condenser. The condenser was attached to a water-gas trap for HCl released during the reaction. $AlCl_3$ (56.0 g; 420 mmol) was added in portions during which time the mixture turned dark brown. Stirring became difficult in the thick mixture. The reaction was heated at 70° C. for 1 h and then cooled to room temperature. Ice was added slowly to the flask followed by concentrated HCl solution. A large clump of solid stuck to the bottom of the flask. This was washed multiple times with water and then dissolved in $CH_2Cl_2$, washed with water, dried over $Na_2SO_4$ and concentrated to give an oily solid. Hexane was added and after sonication, a blue-white solid was collected by filtration. Drying gave product as white solid 32.0 g (54% yield). $^1H$ NMR ($CDCl_3$) δ (ppm): 1.33 (s, 18 H), 7.30 (d, J=8.0 Hz, 1H), 7.43 (d, J=8.3 Hz, 2H), 7.63–7.70 (m, 3H), 8.08 (s, 1H); $^{13}C$ NMR ($CDCl_3$): 30.98, 34.92, 125.36, 125.41, 127.78, 127.84, 128.02, 129.51, 129.60, 129.81, 134.56, 139.83, 152.94, 156.80, 170.80, 196.89.

Example 5
Synthesis of 2,6/2,7-di-t-butyl-anthraquinone (compound 5)

4-t-Butyl-2-benzoylbenzoic acid 4 (32.0 g; 95 mmol) was placed into a round-bottom flask and oleum (30%, 290 mL) was then added. The reaction mixture turned black and the reaction temperature was increased to 120° C. and stirred for 3 h. The mixture was then poured into ice. The aqueous mixture was extracted using $CH_2Cl_2$ (5×), dried over $Na_2SO_4$ and concentrated to give a dark solid. This solid was passed through a silica gel column using $CH_2Cl_2$ as eluent. After concentrating, the yellow-brown solid was recrystallized from hexane to give product as yellow crystals 21.0 g (69% yield). $^1H$ NMR ($CDCl_3$) δ (ppm): 1.42 (s, 18H), 7.80 (d, J=8.2 Hz, 1H), 7.81 (d, J=8.2 Hz), 8.20 (d, J=8.2 Hz, 1H),), 8.22 (d, J=8.2 Hz, 1H), 8.31 (s, 2H); $^{13}C$ NMR ($CDCl_3$): 31.01, 35.58, 123.83, 123.90, 127.17, 127.28, 131.08, 131.15, 131.34, 131.42, 133.40, 133.49, 157.94, 158.05, 182.76, 183.28,183.78.

Example 6
Synthesis of 2,6/2,7-di-t-butyl-anthracene (compound 6)

2,6-Di-t-butyl-anthraquinone 5 (10.0 g; 313 mmol), tin (18.0 g, 151 mmol), and 50 mL of glacial acetic acid were added to a round-bottom flask and heated to reflux. During heating, the anthraquinone 5 went into solution and a new solid started to precipitate out. After 3 h, TLC showed all starting material 5 disappeared. After cooling to room temperature, the mixture was poured into ice and stirred for 30 minutes. $CH_2Cl_2$ was added and after separation, the aqueous layer was extracted with $CH_2Cl_2$ (3×). The combined organic layers were dried over $Na_2SO_4$ and concentrated to yield a sticky, oily solid. This was used without further purification in the subsequent reaction.

The oily solid was dissolved in 110 mL of isopropyl alcohol and of $NaBH_4$ (13.0 g, 333 mmol) was added in portions. The reaction was refluxed overnight. TLC indicated the completion of the reaction. After cooling to room temperature the reaction was neutralized with HCl (6 M) solution during which time a solid precipitated out of solution. Additional water was added and the product was collected by vacuum filtration, washed thoroughly with water and dried in an oven to give 8.80 g product (97% yield).). $^1H$ NMR ($CDCl_3$) δ (ppm): 1.43 (s, 18H), 7.48–7.53 (m, 2H), 7.85–7.91 (m, 2H), 8.26–8.30 (m, 2H) $^{13}C$ NMR ($CDCl_3$): 30.98, 34.89, 122.17, 122.25, 124.51, 124.70, 124.91, 125.36, 125.80, 127.71, 127.77, 130.05, 130.45, 131.55, 131.96, 147.23, 147.43.

Example 7
Synthesis of 2,6/2,7-di-t-butyl-9,10-dibromoanthracene (compound 7)

2,6-Di-t-butyl-anthracene 6 (4.0 g; 13.8 mmol) was dissolved in 150 mL $CCl_4$ and then bromine (1.42 mL; 27.6 mmol) was added dropwise. After stirring at room temperature overnight, TLC indicated the completion of the reaction. The reaction mixture was poured into water and a concentrated solution of sodium thiosulfate was added. After stirring for 60 minutes, the layers were separated, the aqueous layer was extracted with $CH_2Cl_2$ (3×) and the combined organic layer was dried over $Na_2SO_4$ and concentrated to give a yellow solid. This solid was recrystallized from EtOH to give pure product 6.02 g (97% yield). $^1H$ NMR ($CDCl_3$) δ (ppm): 1.48 (s, 18H), 7.69–7.71(m, 2H), 8.45–8.51 (m, 4H); $^{13}C$ NMR ($CDCl_3$): 30.88, 35.28, 122.59, 122.93, 126.87, 128.00, 128.08, 129.88, 130.64, 149.77; M.p. 150–152° C.; FD-MS: m/z 368 (M$^+$).

Example 8
Synthesis of 9,9-bis(4-methoxyphenyl)-9-fluorene (compound 8)

9,9-Bis(4-hydroxylphenyl)-9-fluorene (50.0 g, 142 mmol), potassium carbonate (40.0 g, 0.29 mol), and iodomethane (35 mL, 0.562 mol) were placed into a round-bottom flask under nitrogen. After stirring at room temperature for 48 hours, TLC indicated the completion of the reaction. Most of the DMF was distilled off and the reaction mixture was poured to water. A white solid precipitates out and after stirring for 60 minutes, the white solid was collected by vacuum filtration. This material is purified on a silica gel column using hexane:$CH_2Cl_2$ (3:1) as eluent to give product 50.8 g as white solid (94% yield). $^1H$ NMR ($CDCl_3$) δ (ppm): 3.73 (s, 6H), 6.74 (d, J=6.9 Hz, 4H), 7.10 (d, J=6.8 Hz, 4H), 7.22–7.38 (m, 6H), 7.74 (d, J=7.4 Hz, 2H); $^{13}C$ NMR ($CDCl_3$); 55.18, 113.54, 120.10, 126.01, 127.29, 127.64, 129.16, 138.12, 139.96, 151.88, 158.30;

Example 9
Synthesis of 2,7-dibromo-9,9-bis-(4-methoxyphenyl)-9-fluorene (compound 9)

9,9-Bis-(4-methoxyphenyl)-9-fluorene 8 (5.0 g, 13.2 mmol), NBS (4.9 g, 27.7 mmol) and anhydrous DMF (75 mL) were placed under nitrogen in a round-bottom flask. The reaction was stirred for 15 h at room temperature. TLC showed the completion of the reaction. The reaction mixture was poured into water and a white solid precipitated out. The product was filtered, washed with water, and dried, yield 6.6 g (94% yield). $^1H$ NMR ($CDCl_3$) δ (ppm): 3.79 (s, 6H), 6.72 (d, J=8.7 Hz, 2H), 7.07 (dd, J$_1$=8.6 Hz, J$_2$=2.3 Hz, 2H), 7.22–7.37 (m, 8H), 7.73 (d, J=8.2 Hz, 2H); $^{13}C$ NMR ($CDCl_3$): 56.19, 63.49, 111.55, 111.67, 120.34, 125.80, 127.80, 127.93, 128.00, 128.10, 132.66, 139.16, 150.54, 154.75; FD-MS: m/z 536 (M$^+$).

Example 10
Synthesis of 5,5'-dibromo-2,2'-bithiophene (compound 10)

2,2'-Bithiophene (10.0 g, 0.060 mol) was dissolved in 70 mL of DMF and cooled to 0° C. To this solution was added NBS (22.50 g, 0.126 mol) in 80 mL of DMF. Large amount of white precipitated formed upon the addition of NBS. After stirred at room temperature for an hour, TLC indicated the completion of the reaction. The precipitate was collected by filtration and washed with water. The crude product was recrystallized from toluene to give flake-like off-white crystals 17.03 g (87% yield). $^1H$ NMR ($CDCl_3$) δ (ppm): 6.83 (d, J=3.8 Hz, 2H), 6.94 (d, J=3.8 Hz, 2H).

Example 11
Synthesis of 2,6-dibromo-1,5-dihexyloxy naphthalene (compound 11)

1,5-Dihydroxynaphthalene (20.0 g, 0.125 mol) was dissolved in 400 mL of acetic acid and cooled to 0° C. To this solution was added bromine (40.1 g, 0.250 mol) dropwise. The reaction was stirred at room temperature for an hour after addition and cooled in ice bath. The crystals were collected by filtration, washed with water, and dried to give light gray solid 2,6-dibromo-1,5-dihydroxynaphthalene 36.1 g (90% yield). The product (36.0 g, 0.114 mol) was mixed with sodium methoxide (13.0 g, 0.24 mol), and iodohexane (50.0 g, 0.24 mol) in 320 mL of methanol. The mixture was refluxed overnight and cooled to room temperature. The dark solid was collected, washed with water and methanol, and dried. The crude product was dissolved in methylene chloride and then passed through a short pad of silica gel to remove the dark polar impurities. The product was then recrystallized from methanol to give white flake crystals 25.5 g (60% yield). $^1H$ NMR ($CDCl_3$) δ (ppm): $^1H$ NMR ($CDCl_3$) δ (ppm): 0.93 (t, J=6.8 Hz, 6H), 1.36–1.41 (m, 8H), 1.55–1.60 (m, 4H), 1.88–1.98 )m, 4H), 4.06 (t, J=6.6 Hz, 4H), 7.58 (d, J=9.0 Hz, 2H), 7.73 (J=9.0 Hz, 2H); $^{13}C$ NMR ($CDCl_3$): 14.03, 22.61, 25.69, 30.23, 31.69, 74.62, 113.73, 119.31, 130.11, 131.03, 148.04, 152.86; M.p. 41–43° C.; FD-MS: m/z 486 (M$^+$).

Example 12
Synthesis of 1-6-dihexyloxy-naphthalene-2,6-dicarboxaldehyde (compound 12)

2,6-Dibromo-1,5-dihexyloxy naphialene 11 (13.0 g, 0.027 mol) was dissolved in 110 mL of anhydrous THF and cooled to −78° C. under dry nitrogen. To this solution was added slowly nBuLi solution (2.5 M in hexane, 32 mL, 0.080 mol) via a syringe to maintain the temperature lower than −60° C. After addition the solution was stirred at −78° C. for 1 h. Anhydrous DMF (17 mL, 0.21 mol) was added via a syringe. The reaction was stirred at room temperature overnight. The reaction was quenched with water and extracted with ether (3×100 mL). The organic phase was washed with brine and dried over $MgSO_4$. After removal of solvent the crude product was recrystallized from hexane to give 6.72 g of product as light yellow powder (65% yield). $^1H$ NMR ($CDCl_3$) δ (ppm): 0.93 (t, J=6.7 Hz, 6H, $CH_3$), 1.37–1.42 (m, 8H, alkyl), 1.55–1.60 (m, 4H, alkyl), 1.95–2.00 (m, 4H, alkyl), 4.15 (t, J=6.7 Hz, 4H, $OCH_2$), 7.92

(d, J=8.8 Hz, 2H, naphthyl), 7.89 (d, J=8.8 Hz, 2H, naphthyl), 10.60 (s, 2H, CHO); $^{13}$C NMR (CDCl$_3$): 14.01, 22.59, 25.65, 30.25, 31.63, 79.50, 119.53, 123.69, 127.51, 133.19, 161.56, 189.51; M.p. 50–52° C.; FD-MS: m/z 384 (M$^+$);

Example 13

Synthesis of 2,6-di(2-(4-bromophenyl)ethenyl)-1,5 dihexyloxynaphthalene (compound 13)

1-Bromo-4-methylenediethylphosphate benzene (11.56 g, 0.038 mol) (prepared from reaction between 4-bromobenzylbromide and triethyl phosphite) was dissolved in 60 mL of anhydrous DMSO and the solution was cooled to 0° C. To this solution was added potassium t-butoxide (4.65 g, 0.041 mol). The orange red solution was stirred at 0° C. under nitrogen for 30 min. 1,6-Dihexyloxy-naphthalene-2,6-dicarboxaldehyde 12 (7.20 g, 0.019 mol) in 20 mL of anhydrous THF was added dropwise to the above solution. Yellow precipitate formed immediately. The reaction was followed by TLC. After 3 h, the reaction mixture was poured into 250 mL of ice water and the yellow precipitate was collected by filtration and dried. The crude product was recrystallized three times from toluene to give yellow fine needle crystals 6.51 g (50% yield). $^1$H NMR (CDCl$_3$) δ (ppm): 0.94 (t, J=6.7 Hz, 6H, CH$_3$), 1.41 (m, 8H, alkyl), 1.63–1.68 (m, 4H, alkyl), 1.92–1.97 (m, 4H, alkyl), 4.00 (t, J=6.4 Hz, 4H, OCH$_2$), 7.13 (d, J=16.5 Hz, 2H, vinyl), 7.42 (d, J=8.4 Hz, 4H, phenyl), 7.50 (d, J=8.4 Hz, 4H, phenyl), 7.60 (d, J=16.5 Hz, 2H, vinyl), 7.74 (d, J=8.8 Hz, 2H, naphthyl), 7.88 (d, J=8.8 Hz, 2H, naphthyl); $^{13}$C NMR (CDCl$_3$): 14.07, 22.72, 26.12, 30.50, 31.80, 75.83, 118.81, 121.40, 123.62, 123.94, 126.21, 128.01, 128.26, 129.71, 131.87, 136.75, 153.47, 176.88. M.p. 170–172° C.; FD-MS: m/z 688 (M$^+$).

Example 14

Synthesis of 1,3-di(4-iodophenyl)adamantane (compound 14)

1,3-Diphenyladamantane was prepared as follows. A solution of 1-bromoadamantane (30.0 g, 0.139 mol) and tBuBr (38.20 g, 0.278 mol) in 1050 ml of benzene was heated to reflux. To this refluxing solution was added dry aluminum chloride (1.50 g, 0.011 mol). The reaction was heated at vigorous reflux for 20 min. Large amount of HBr evolved and was trapped by NaOH aqueous solution. The reaction was then poured into 600 ml, of ice-water and 600 mL of ether was added. The mixture was stirred for half hour. The insoluble part (1,3,5-triphenyladamantane) was filtered off and the ether layer was dried and evaporated. The solid residue was titurated with ether to separate remaining triphenyladamantane from the product 1,3-diphenyladamantane. The filtrate was evaporated and the residue was recrystallized from methanol to give white crystalline product 10.8 g (27% yield). $^1$H NMR (CDCl$_3$) δ (ppm): 1.80 (s, 2H), 1.97 (s, 8H), 2.05 (s, 2H), 2.32 (s, 2H), 7.16–7.42 (m, 10H); M.p. 149–151° C.

Bis((trifluoroacetoxy)iodo)benzene (26.24 g, 0.061 mol) and 1,3-diphenyl adamantane (16.00 g, 0.055 mol) and were dissolved in 150 mL of anhydrous CH$_2$Cl$_2$. To this solution was added sublimed iodine (14.08 g, 0.055 mol) and the dark purple solution was stirred at room temperature under dry nitrogen for 3 h until the pink color disappeared. Most of the product precipitated out of reaction as white fine crystals. The crystals were collected by filtration and washed with minimum amount of CH$_2$Cl$_2$ to give 24.0 g of pure product. The filtrate was washed with dilute sodium thiosulfate solution (2×80 mL), water (1×80 mL), and dried over MgSO$_4$. Solvent was evaporated and the residue was washed with acetone and filtered to give 2.90 g product (total yield 90%). $^1$H NMR (CDCl$_3$) δ (ppm): 1.76 (s, 2H), 1.88 (s, 8H), 1.93 (s, 2H), 2.30 (s, 2H), 7.10 (d, J=8.5 Hz, 4H, aromatic), 7.6 (d, J=8.5 Hz, 4H, aromatic); $^{13}$C NMR (CDCl$_3$): 29.33, 35.61, 37.14, 41.96, 48.52, 91.04, 127.11, 137.21, 150.05. M.p. 100–102° C.; FD-MS: m/z 540 (M$^+$).

Example 15

Synthesis of adamantane-1,3-diphenyl-2,2-dimethyltrimethylene diboronate (compound 15)

1,3-Di(4-iodophenyl)adamantane (compound) 14 (27.0 g, 0.050 mol) was dissolved in 200 mL of anhydrous THF and the solution was cooled to −78° C. To this solution was added slowly nBuLi solution (60 mL 2.5 M in hexane, 0.150 mol) to keep temperature below −60° C. The mixture was stirred at −78° C. for 1 h and trimethyl borate (22 mL, 0.200 mol) was added slowly. The reaction mixture was slowly warmed up to room temperature and stirred at room temperature overnight. The reaction was quenched with dilute HCl solution and stirred under nitrogen for 1 h. The reaction mixture was then extracted with ether 5 times and dried over MgSO$_4$. Solvent was evaporated and the crude product was used for preparation of diboronate without purification.

The above crude diboronic acid and 2,2-dimethylporpane-1,3-diol (neopentyl glycol) (10.4 g, 0.1 mol) were dissolved in 300 mL of toluene and heated under vigorous reflux with a Dean-Stark trap overnight. After the completion of the reaction, toluene was evaporated and the crude product was recrystallized from toluene to give 7.10 g of product as white solid. $^1$H NMR (CDCl$_3$) δ (ppm): 1.00 (s, 12H, CH$_3$), 1.78 (s, 2H), 1.96 (s, 8H), 2.05 (s,2H) 2.30 (s, 2H), 3.74 (s, 4H, CH$_2$), 7.37 (d, J=8.1 Hz, 4H, aromatic), 7.75 (d, J=8.1 Hz, 4H, aromatic); $^{13}$C NMR (CDCl$_3$): 21.91, 29.60, 31.87, 35.97, 37.46, 42.23, 48.59, 72.28, 124.17, 128.16, 133.87, 153.21. M.p. 249–251° C.; FD-MS: m/z 512 (M$^+$).

SYNTHESIS OF POLYMERS

Example 16

Synthesis of Polymer 92

Adamantane-1,3-diphenyl-2,2-dimethyltrimethylene diboronate 15 (0.68 g, 1.3 mmol), 9,10-dibromo-2,6-di(2-ethylhexyloxy)anthracene 3(0.79 g, 1.3 mmol), and Aliquat® 336 (0.10 g, 0.25 mmol) were dissolved in 6.5 mL of toluene. To this solution was added 2 M Na$_2$CO$_3$ aqueous solution (2.2 mL, 4.4 mmol). The reaction mixture was bubbled with dry nitrogen for 15 min and catalyst tetrakis (triphenylphosphine)palladium (46 mg, 3 mol %) was added. The reaction was heated under vigorous reflux for 24 h, and small amount of phenylboronic acid was added for end-capping of bromo group. The reaction was heated for 13 h and bromobenzene was added to end-cap boronate group. The reaction was heated for another 6 h and then poured into 200 mL of methanol. The precipitated polymer was washed with methanol, diluted HCl solution, and dried to give off-white polymer 0.95 g (95% yield). The polymer was then extracted with acetone with a Sohxlet setup overnight to removed oligomer and residual catalyst. Polymer was re-precipitated from chloroform into methanol three times to give final polymer 0.86 g, as yellow solid.

Example 17

Synthesis of Polymer 47

The procedure used to prepare polymer 92 was followed. Adamantane-1,3-diphenyl-2,2-dimethyltrimethylene diboronate 15 (1.00 g, 1.95 mmol), 9,10-dibromo-2,6-di(2-ethylhexyloxy)anthracene 3 (0.81 g, 1.37 mmol), 9,9,-di(3-bromo-4-methoxypheny)fluorene 9 (0.31 g 0.58 mmol), and Aliquat® 336 (0.10 g, 0.25 mmol) were dissolved in 9.5 mL of toluene. To this solution were added 2 M Na$_2$CO$_3$ aqueous solution (3.2 mL, 6.4 mmol) and catalyst tetrakis (triphenylphosphine)palladium (70 mg, 3 mol %). After polymerization and purification 0.99 g of yellow polymer was obtained.

Example 18
Synthesis of Polymer 129

The procedure used to prepare polymer 92 was followed. Adamantane-1,3-diphenyl-2,2-dimethyltrimethylene diboronate 15 (1.00 g, 1.95 mmol), 9,10-dibromo-2,6-di(2-ethylhexyloxy)anthracene 3(0.81 g, 1.37 mmol), 2,6-di(2-(4-bromophenyl)ethenyl)-1,5-dihexyloxynaphthalenc (compound) 13 (0.40 g 0.58 mmol), and Aliquat® 336 (0.10 g, 0.25 mmol) were dissolved in 9.5 mL of toluene. To this solution were added 2 M $Na_2CO_3$ aqueous solution (3.2 mL, 6.4 mmol) and tetrakis(triphenylphosphine)palladium catalyst (70 mg, 3 mol %). After polymerization and purification 1.18 g of yellow polymer was obtained.

Example 19
Synthesis of Polymer 74

The procedure used to prepare polymer 92 was followed. Adamantane-1,3-diphenyl-2,2-dimethyltrimethylene diboronate 15 (0.90 g, 1.76 mmol), 9,10-dibromo-2,6-di(2-ethylhexyloxy)anthracene 3 (0.83 g, 1.40 mmol), 1,4-dibromobenzene (0.08 g 0.34 mmol), and Aliquat® 336 (0.09 g, 0.22 mmol) were dissolved in 7.6 mL of toluene. To this solution were added 2 M $Na_2CO_3$ aqueous solution (2.9 mL, 5.8 mmol) and catalyst tetrakis(triphenylphosphine) palladium (60 mg, 3 mol %). After polymerization and purification 0.81 g of yellow polymer was obtained.

Example 20
Synthesis of Polymer 148

The procedure used to prepare polymer 92 was followed. Adamantane-1,3-diphenyl-2,2-dimethyltrimethylene diboronate 15 (0.90 g, 1.76 mmol), 9,10-dibromo-2,6-di(2-ethylhexyloxy)anthlracene 3 (0.83 g, 1.40 mmol), 5,5'-dibromo-2,2-bithophene 10 (0.11 g 0.34 mmol), and Aliquat® 336 (0.09 g, 0.22 mmol) were dissolved in 7.6 mL of toluene. To this solution were added 2 M $Na_2CO_3$ aqueous solution (2.9 mL, 5.8 mmol) and catalyst tetrakis (triphenylphosphine)palladium (60 mg, 3 mol %). After polymerization and purification 0.85 g of yellow polymer was obtained.

Example 21
Synthesis of Polymer 147

The procedure used to prepare polymer 92 was followed. Adamantanc-1,3-diphenyl-2,2-dimethyltrimethylene diboronate 15 (0.90 g, 1.76 mmol), 9,10-dibromo-2,6-di(2-ethylhexyloxy)anthracene 3 (0.83 g, 1.40 mmol), 2,5-dibromo-thophene (0.090 g, 0.34 mmol), and Aliquat® 336 (0.09 g, 0.22 mmol) were dissolved in 7.6 mL of toluene. To this solution were added 2 M $Na_2CO_3$ aqueous solution (2.9 mL, 5.8 mmol) and catalyst tetrakis(triphenylphosphine) palladium (60 mg, 3 mol %). After polymerization and purification 0.86 g of yellow polymer was obtained.

Example 22
Synthesis of Polymer 91

The procedure used to prepare polymer 92 was followed. Adamantane-1,3-diphenyl-2,2-dimethyltrimethylene diboronate 15 (0.90 g, 1.76 mmol) and 9,10-dibromo-2,6/8-di-t-butylanthracene 7 (0.79 g, 1.76 mmol) were dissolved in 7.6 mL of toluene. To this solution were added 2 M $Na_2CO_3$ aqueous solution (2.9 mL, 5.8 mmol) and catalyst tetrakis (triphenylphosphine)palladium (60 mg, 3 mol %). After polymerization and purification 0.64 g of off-white polymer was obtained.

Example 23
Synthesis of Polymer 90

The procedure used to prepare polymer 92 was followed. Adamantane-1,3-diphenyl-2,2-dimethyltrimethylene diboronate 15 (0.90 g, 1.76 mmol) and 9,10-dibromanthracene (0.59 g, 1.76 mmol) were dissolved in 7.6 ml, of toluene. To this solution were added 2 M $Na_2CO_3$ aqueous solution (2.9 mL, 5.8 mmol) and catalyst tetrakis(triphenylphosphine) palladium (60 mg, 3 mol %). After purification 0.80 g of off-white polymer was obtained.

EL DEVICE FABRICATION AND PERFORMANCE

Example 24

An EL device satisfying the requirements of the invention was constructed in the following manner. The organic EL medium has single layer of polymer thin film.

(a) An indium-tin-oxide (ITO) coated glass substrate was sequentially ultra-sonicated in a commercial detergent, rinsed with deionized water, degreased in toluene vapor and exposed to ultraviolet light and ozone for a few minutes.

(b) A toluene solution of a polymer (30 mg in 30 mL of toluene) was filtered through a 2 μm Teflon filter. The polymer solution was then spin-coated onto ITO under a controlled spinning speed. The thickness of the polymer film was between 500–700 Angstroms.

(c) On top of the polymer film was deposited a cathode layer 2000 Angstroms thick consisting of a 10:1 atomic ratio of Mg and Ag.

The above sequence completed the deposition of the EL device. The device was then hermetically packaged in a dry glove box for protection against ambient environment.

The blue light output from EL device was about 50 $cd/m^2$ at about 10 V.

Figure 4:
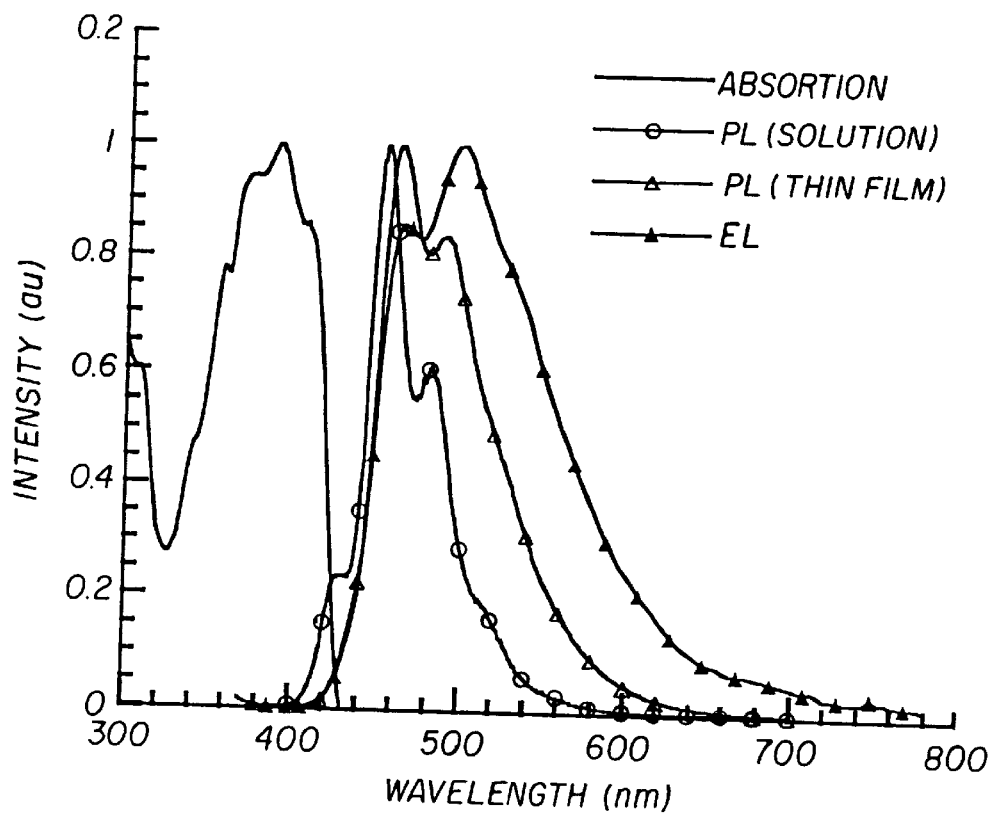
FIG. 4 illustrates the absorption and photoluminescence spectra of polymer 129 and electroluminescence spectrum of single-layer EL device fabricated from polymer 129.
Figure 5:
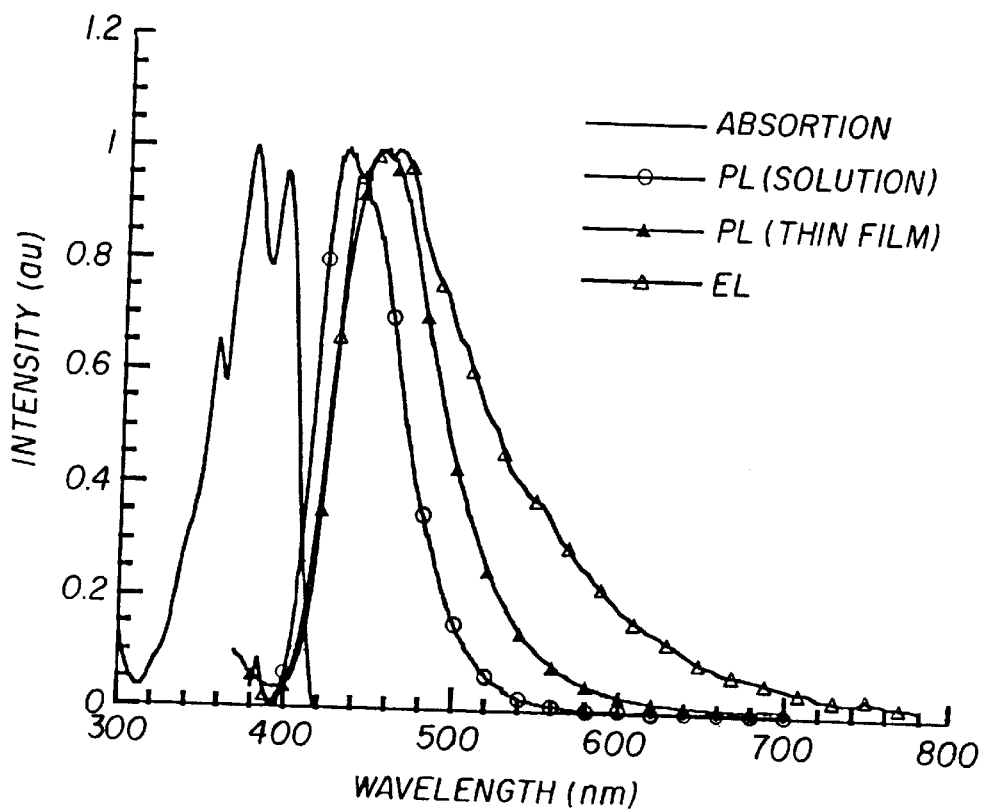
FIG. 5 illustrates the absorption and photoluminescelnce spectra of polymer 91 and electroluminescence spectrum of single-layer EL device fabricated from polymer 91.
Figure 6:
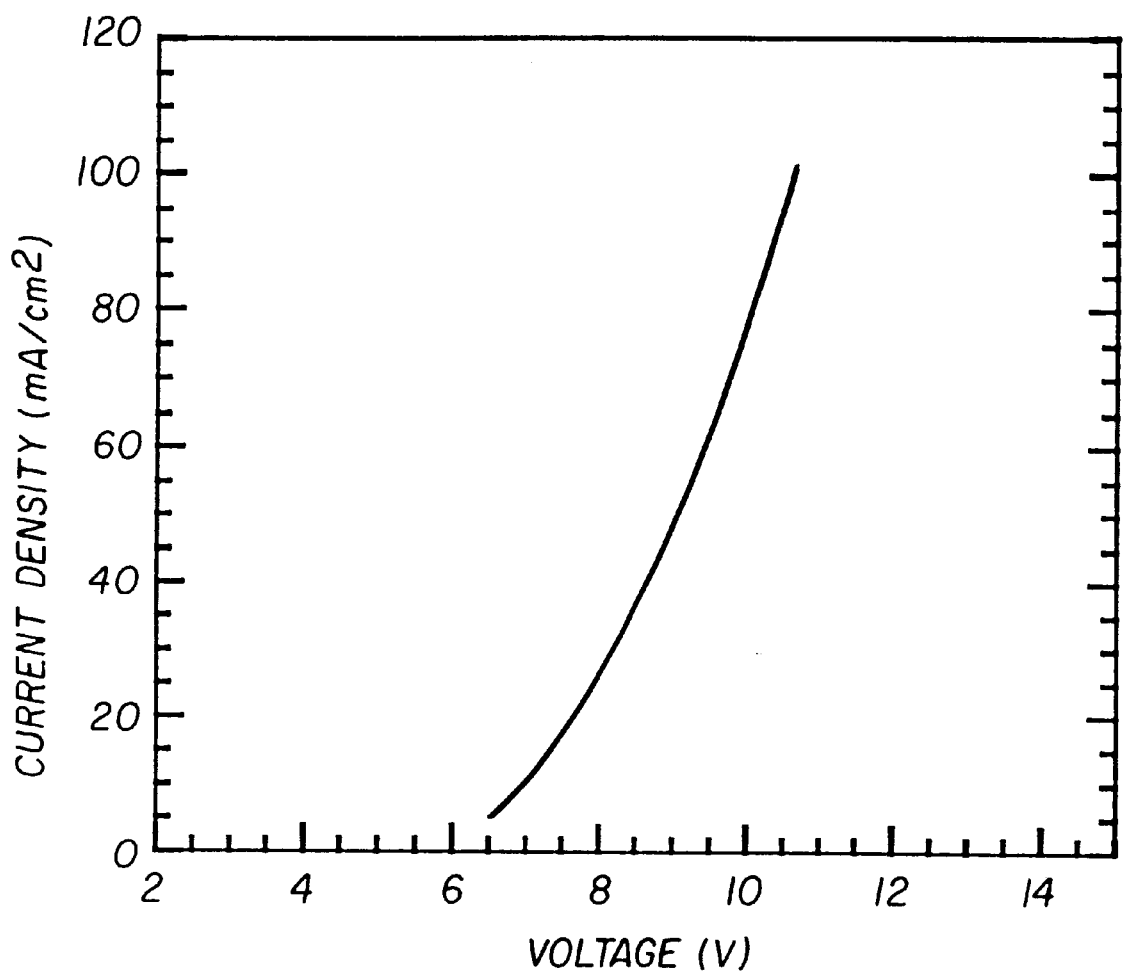
FIG. 6 illustrates the voltage-current density and luminance characteristics of a single-layer EL device fabricated from polymer 129.

Table 1 summarizes the characterization of the polymers prepared in the present invention. Polymers have reasonable molecular weights and show high $T_g$ and $T_d$. UV and photoluminescence (PL) spectra were obtained from dilute solutions and solid thin films of the polymers and EL spectra were obtained from ITO/polymer/Mg:Ag EL devices. The fabrication of EL devices was illustrated in example 24. FIGS. 4 and 5 show the UV, PL and El spectra of polymers 129 and 91 respectively. The voltage-current characteristics of the EL device of polymer 129 is shown in FIG. 6.

TABLE 1

Characterization of polymers according to Examples.

| Polymer | $M_w$[a] | $T_d$(° C.) | $T_g$(° C.) | UV ($\lambda_{max}$ nm) | PL ($\lambda_{max}$ nm)[b] | EL ($\lambda_{max}$ nm) |
|---|---|---|---|---|---|---|
| 47 | 11,000 | 392 | 194 | 395 | 454 | 460, 490 |
| 74 | 9,470 | 387 | 169 | 406 | 454 | 460, 496 |
| 91 | 6,750 | 518 | NO[c] | 376 | 431[d] | 448, 460 |
| 92 | 13,900 | 386 | NO[c] | 407 | 453 | 460, 500 |
| 129 | 12,400 | 374 | 162 | 390 | 454[d] | 462, 496 |
| 147 | 9,270 | 391 | 154 | 406 | 454 | 460, 496 |
| 148 | 8,300 | 397 | 150 | 395 | 453 | 460, 504 |

[a]weight average molecular weight, determined by size exclusion chromatography in THF using polystyrene standard. [b]excited at 400 nm [c]not observed [d]excited at 375 nm; both UV and PL are measured in dilute toluene solution.

The invention has been described in detail with particular reference to certain preferred embodiments thereof, but it will be understood that variations and modifications can be effected within the spirit and scope of the invention.

PARTS LIST

| | |
|---|---|
| 10 | substrate |
| 20 | anode |
| 30 | hole transport layer |
| 40 | electron transport layer |
| 50 | EL medium |
| 60 | cathode |
| 100 | substrate |
| 200 | anode |
| 300 | hole transport layer |
| 400 | emissive layer |
| 500 | electron transport layer |
| 600 | BL medium |
| 700 | cathode |
| 1000 | substrate |
| 2000 | anode |
| 3000 | emitting layer |
| 4000 | cathode |

What is claimed is:

1. An electroluminescent device comprises an anode, a cathode, and polymeric luminescent materials disposed between the anode and cathode, the polymeric luminescent materials includes 9-(4-adamantanyl)phenyl)-10-phenylanthiracene-based polymers of the following formula:

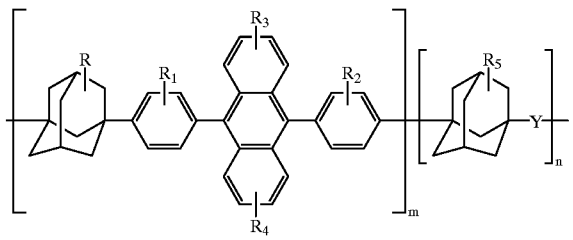

wherein:
substituenits R, $R_1$, $R_2$, $R_3$, $R_4$ and $R_5$ are each individually hydrogen, or alkyl or alkoxy of from 1 to 24 carbon atoms; aryl or substituted aryl of from 6 to 28 carbon atoms; or heteroaryl or substituted heteroaryl of from 4 to 40 carbons; or F, Cl, Br; or a cyano group; or a nitro group; wherein
the ratio of n/(m+n) is between 0 to 1 wherein m and n are integers but m cannot be 0; and Y is a divalent linking group.

2. The electroluminescent device of claim 1 wherein the ratio of n/(m+n) is less than 0.30.

3. The electroluminescent device of claim 1 wherein Y is alkyl, aryl or heteroaryl groups.

4. The electroluminescent device of claim 1 wherein Y has the following group:
two aryl groups connected by a linking group X of the formula:

—(Ar$_1$)—X—(Ar$_2$)— wherein:
Ar$_1$ and Ar$_2$ are substituted or unsubstituted aromatic groups containing 6 to 28 carbon atoms; and
X are linking groups containing 0–12 carbon atoms, or N, Si, O, or S atoms.

5. The electroluminescent device of claim 1 wherein Y has the following group:
an aromatic hydrocarbon of the formula:

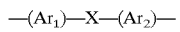

wherein:
Ar is substituted or unsubstituted aryl groups with 6 to 28 carbon atoms.

6. The electroluminescent device of claim 1 wherein Y includes the following group:
aromatic hydrocarbons linked by a double bond of the formula:

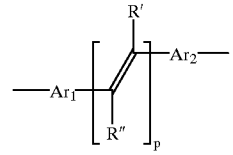

wherein:
Ar$_1$ and Ar$_2$ are substituted or unsubstituted alyl groups with 6 to 28 carbon atoms;
R' and R" are hydrogen, alkyl group containing 1–12 carbon atoms, or Cl, Br, F, or CN groups; and
p is an integer from 1–3.

7. The electroluminescent device of claim 1 wherein Y includes the following group:
heteroaromatics of the formula:

—(W)— wherein:
W is substituted or unsubstituted heteroaryl groups with 4–40 carbon atoms, and includes at least one N, S, or O atom.

8. An electroluminescent device comprises an anode, a cathode, and polymeric luminescent materials disposed between the anode and cathode, the polymeric luminescent materials includes 9-(4-adamantaniyl)phenyl)-10-phenylanthracene-based polymers of the following formula:

(I)

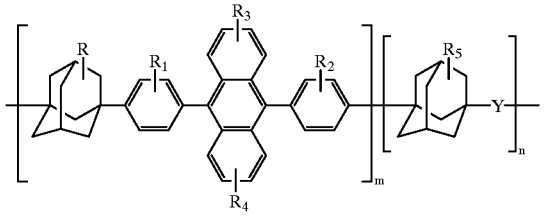

wherein:
substituents R, $R_1$, $R_2$, $R_3$, $R_4$ and $R_5$ are each individually hydrogen, or alkyl or alkoxy of from 1 to 24 carbon atoms; aryl or substituted aryl of from 6 to 28 carbon atoms; or hetcroaryl or substituted heteroaryl of from 4 to 40 carbons; or F, Cl, Br; or a cyano group; or a nitro group; wherein
the ratio of n/(m+n) is between 0 to 1 wherein m and n are integers but m cannot be 0; and Y are two or more of the following divalent groups:
Group I
Y is an alkyl or alkoxy group;
Group II
Y are two aryl groups connected by a linking group X of the formula:

—(Ar$_1$)—X—(Ar$_2$)— wherein:

Ar$_1$ and Ar$_2$ are substituted or unsubstituted aromatic groups containing 6 to 28 carbon atoms; and X are linking groups containing 0–12 carbon atoms, or N, Si, O, or S atoms;

Group III

Y is an aromatic hydrocarbon of the formula:

—(Ar)— wherein:

Ar is substituted or unsubstituted aryl groups with 6 to 28 carbon atoms;

Group IV

Y are aromatic hydrocarbons linked by a double bond of the formula:

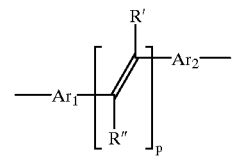

wherein:

Ar$_1$ and Ar$_2$ are substituted or unsubstituted aryl groups with 6 to 28 carbon atoms;

R' and R" are hydrogen, alkyl group containing 1–12 carbon atoms, or Cl, Br, F, or CN groups; and p is an integer from 1–3; or Group V Y are heteroaromatics of the formula:

—(W)— wherein:

W is substituted or unsubstituted heteroaryl groups with 4–40 carbon atoms, and includes at least one N, S, or O atom.

* * * * *